United States Patent
Yang et al.

(10) Patent No.: US 7,820,516 B2
(45) Date of Patent: Oct. 26, 2010

(54) METHODS OF MANUFACTURING NON-VOLATILE MEMORY DEVICES HAVING A VERTICAL CHANNEL

(75) Inventors: Seung-Jin Yang, Seoul (KR); Hyok-ki Kwon, Young-In (KR); Yong-Seok Choi, Seoul (KR); Jeong-Uk Han, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 550 days.

(21) Appl. No.: 11/798,563

(22) Filed: May 15, 2007

(65) Prior Publication Data

US 2008/0002475 A1  Jan. 3, 2008

(30) Foreign Application Priority Data

Jun. 29, 2006   (KR) .................. 10-2006-0059608

(51) Int. Cl.
*H01L 21/336* (2006.01)
(52) U.S. Cl. ................. 438/294; 257/E21.409
(58) Field of Classification Search ............. 438/258, 438/261, 411, 418, 689, 242, 266, 706; 257/E21.21, 257/E21.423, E21.679, E27.103, E29.309
See application file for complete search history.

(56) References Cited

U.S. PATENT DOCUMENTS

| 6,495,294 | B1 * | 12/2002 | Yamauchi et al. | ........... 438/597 |
| 6,798,015 | B2 | 9/2004 | Kasuya | |
| 7,268,058 | B2 * | 9/2007 | Chau et al. | ........... 438/429 |
| 2007/0049015 | A1 * | 3/2007 | Nejad et al. | ........... 438/649 |

FOREIGN PATENT DOCUMENTS

| JP | 2002-359303 | 12/2002 |
| JP | 2002359303 A | * 12/2002 |
| KR | 2002-359303 | 12/2002 |
| KR | 10-2005-0055119 | 6/2005 |

OTHER PUBLICATIONS

Korean Notice of Allowance (dated Dec. 27, 2007) for counterpart Korean Patent Application No. 10-2006-0059608 is provided for the purpose of certification under 37 C.F.R. §§ 1.97(e).
Office Action for corresponding Korean Application No. 10-2006-0059608 dated Jun. 27, 2007.

* cited by examiner

*Primary Examiner*—Sue Purvis
*Assistant Examiner*—Selim Ahmed
(74) *Attorney, Agent, or Firm*—Harness, Dickey & Pierce, P.L.C.

(57) ABSTRACT

Disclosed are pairs of semiconductor flash memory cells including first and second source lines formed in a semiconductor substrate, semiconductor pillars extending from the substrate between the source lines, first and second charge storage structures formed on opposite side surfaces of the semiconductor pillar and separated by trench isolation structures. The x and y pitch separating adjacent semiconductor pillars in the memory cell array are selected whereby forming the trench isolation structures serves to separate both charge storage structures and conductive structures provided on opposite sides of a semiconductor pillars. Also disclosed are methods of fabricating such structures whereby the density of flash memory devices, particularly NOR flash memory devices, can be improved.

20 Claims, 21 Drawing Sheets

METHODS OF MANUFACTURING NON-VOLATILE MEMORY DEVICES HAVING A VERTICAL CHANNEL

PRIORITY STATEMENT

This non-provisional application claims priority under 35 U.S.C. §119(a) from Korean Patent Application No. 10-2006-0059608, which was filed on Jun. 29, 2006, in the Korean Patent Office and which is incorporated herein, in its entirety, by reference.

BACKGROUND

1. Field of Endeavor

The example embodiments encompass methods of forming non-volatile memory cells, non-volatile memory cells having particular structural characteristics and semiconductor devices incorporating such non-volatile memory cells. In particular, example embodiments include methods of forming 2. Related Art Non-volatile memory, or non-volatile storage, is computer memory that can retain the stored information for long periods without requiring any electrical power. Examples of non-volatile memory include read-only memories, flash memories, most types of magnetic computer storage devices (e.g., hard disks, floppy disk drives, and magnetic tape) and optical storage devices (e.g., CD, DVD and Blu-ray disks). Non-volatile memories may be used as secondary storage devices, e.g., memory devices that cooperate with dynamic primary storage devices to maintain data while reducing energy requirements, particularly in portable battery-powered devices.

Currently, the most widely used form of primary storage are volatile memory devices broadly categorized as random access memory (RAM) devices, particularly dynamic random access memory (DRAM) devices. Although these volatile memory devices typically provide certain advantages over corresponding non-volatile devices, for example, with respect to processing speed or size, but typically exhibit certain fundamental disadvantages, for example, significantly higher power consumption.

Flash memories store information in an array of floating gate transistors, also referred to as "memory cells," each of which is conventionally configured for storing one bit of information corresponding to a bistable parameter, for example, conductivity, charge or gate threshold voltage. Some newer flash memory devices, which are sometimes referred to as multi-level cell devices, are configured for storing more than 1 bit per cell and utilize a parameter that can exhibit more than two distinct levels.

In NOR flash memory devices the individual memory cells typically exhibit a transistor structure that includes a control gate (CG) much like a conventional MOS transistor and a floating gate (FG) that is isolated from surrounding conductors by a dielectric material (also referred to as an interpoly dielectric (IPD)) and is positioned between the CG and the substrate. The IPD isolates the floating gate and can be formed from any suitable dielectric material including, for example, silicon oxide or a composite material such as oxide-nitride-oxide (ONO).

Because the FG is isolated, electrons added to the FG tend to remain on the FG and will affect the electric field generated by the CG, thereby modifying the threshold voltage ($V_t$) of the transistor cell as illustrated graphically in FIGS. 1A and 1B. Accordingly, when the memory cell is "read" by applying a specific voltage to the CG that will result in a flow of electrical current through the transistor if the FG is sufficiently discharged or substantially no flow of electrical current through the transistor is the FG has been "programmed" and carries sufficient electrons to increase the $V_t$ of the memory cell to a level above the voltage applied to the CG. This presence or absence of current is, in turn, sensed and transformed into a 1 or a 0, thereby allowing the data stored in the memory cell to be "read." In multi-level cell devices, however, the magnitude of current flow will be sensed and analyzed to determine the approximate number of electrons that have been stored on the FG, thereby providing for memory states in addition to a 1 or a 0.

NOR flash memory cells may be programmed by initiating electron flow between the source and drain and then applying a sufficiently large voltage to the CG to produce a electric field sufficient to draw electrons through the insulating material surrounding the FG, a process sometimes referred to as hot-electron injection. In order to erase (for example, resetting all the memory cells to 1's in preparation for programming) a NOR flash cell, a voltage differential is established between the CG and source sufficient to induce movement of the electrons from the FG to the source through a process referred to as quantum tunneling or Fowler-Nordheim (F-N) tunneling. As will be appreciated by those skilled in the art, the performance achieved with this tunneling phenomenon depends on the properties of the materials and the configuration of the elements including, for example, cathode elements having higher aspect ratios may be utilized for producing higher field emission currents. The current density produced by a given electric field is governed by the Fowler-Nordheim equation. In single-voltage devices the high voltage needed for quantum tunneling may be generated using an on-chip charge pump.

NOR flash memory devices are typically configured in a manner that groups memory cells into erase segments, also referred to as blocks or sectors, that must be erased at the same time while still providing for programming the memory cells within such an erase segment one byte or word at a time. In contrast to NOR flash memory devices, NAND flash memory devices are typically configured to utilize quantum tunneling for both programming (writing) and erasing (reset) operations.

NOR flash memory devices and NAND flash memory devices tend to be utilized in somewhat different applications. NOR flash memory devices, for example, typically provide better random access and tend to be used more widely as code and data memory devices in applications such as BIOS/Networking (including, for example, PC, router and hub applications), telecommunications (for example, switchers), cellular phones, POS (point of sale), PDA (personal digital assistants) and PCA (program calibration array) (for example, code, call and contact data). NAND flash memory devices, however, typically provide lower cost and higher densities and tend to be used more widely as mass storage devices in applications such as memory cards (including, for example, mobile computers and USB flash drives), solid state disks (including rugged or hardened storage applications), digital cameras (including both still and moving images) and voice and/or audio recorders (providing, for example, near CD quality recordings).

As the density of flash memory devices increases, the area available for formation of the individual memory cells decreases and the number of electrons that may be loaded onto a particular floating gate also decreases. Reduced spacing between memory cells can contribute to coupling between adjacent floating gates that will affect the cell write characteristics. Various designs have, therefore, been proposed for improving the electrical isolation between adjacent memory cells at higher integration densities.

As noted above, compared with NAND flash memory devices, NOR flash memory devices tend to exhibit longer erase and write times but also provide full address/data (memory) interface that allows random access to any location within the memory cell array. This feature makes NOR flash memory devices generally more suitable for storing program code that do not need to be updated frequently, for example, a computer's BIOS (basic input/output system) or the firmware of cable and satellite "boxes" associated with television signals. Conversely, relative to NOR flash memory devices, NAND flash memory devices tend to exhibit faster erase and write times, higher density, lower cost per bit and improved endurance. NAND flash memory devices, however, typically utilize an I/O interface that provides for only sequential access to the stored data, thereby tending to slow the recovery of stored data. Accordingly, NAND flash memory devices are generally more suitable for mass-storage devices and somewhat less useful for computer memory.

Relative to hard disk drives, both NOR and NAND flash memory devices are limited in that they can provide only a finite number of erase-write cycles (although because many commercial flash memory products are designed to withstand one million programming cycles this limitation may be largely irrelevant for many applications). One technique for addressing this limitation utilizes chip firmware and/or file system drivers to count the writes to each sector and dynamically remap the blocks in order to spread the write operations more evenly between the sectors and/or by utilizing write verification and remapping to spare sectors when a write failure is detected.

SUMMARY OF EXAMPLE EMBODIMENTS

Example embodiments include pairs of semiconductor flash memory cells comprising: a semiconductor substrate; first and second source lines formed in the semiconductor substrate; a semiconductor pillar extending from the semiconductor substrate between the first and second source lines; first and second charge storage structures formed on opposite side surfaces of the semiconductor pillar and configured to cooperate with the first and second source lines respectively; first and second trench isolation structures adjacent the semiconductor pillar that electrically separate both the first and second charge storage structures; a first word line adjacent the first charge storage structure and a second word line adjacent the second charge storage structure; and a common drain contact on an upper surface of the semiconductor pillar.

Other example embodiments of such flash memory cells may include charge storage structures including a tunnel layer pattern formed on a side surface of the semiconductor pillar; a charge storage layer pattern formed on the tunnel layer pattern; and a blocking layer pattern formed on the charge storage layer pattern. As will be appreciated, only certain regions of the tunnel layer pattern will actually be utilized for during an erase ("ERS") operation including, for example, those portions of the pattern arranged between the charge storage layer pattern and a word line. Conversely, other regions of the tunnel layer pattern will be utilized during a program ("PGM") operation including, for example, those portions of the pattern between the charge storage layer pattern and the junction formed in the substrate. Example embodiments of the tunnel layer pattern include patterns formed from an insulating material selected from a group consisting of silicon oxides, silicon nitrides, silicon oxynitrides and combinations thereof; example embodiments of the charge storage layers include patterns formed from a material selected from a group consisting of $Si_xN_y$, $Al_2O_3$, $HfAlO_x$, $HfAlON$, $HfSiO_x$, $HfSiON$ and combinations thereof; and example embodiments of the blocking layer include patterns formed from an insulating material selected from a group consisting of $SiO_x/Si_xN_y/SiO_x$, $SiO_x$, $Si_xN_y$, $Al_2O_3$, $HfAlO_x$, $HfAlON$, $HfSiO_x$, $HfSiON$ and combinations thereof.

Example embodiments of semiconductor flash memory cells also include cells in which the charge storage layer pattern is configured as a layer, nanodots, spheres, hemispheres or combinations thereof. Example embodiments of semiconductor flash memory cells also include cells in which the first and second word lines are a conductive material selected from a group consisting of TaN, NiTa, Ti, TiN, Ta, W, WN, Hf, Nb, Mo, $Ru_2O$, $Mo_2N$, Ir, Pt, Co, Cr and alloys thereof, doped polysilicon, and combinations thereof. Example embodiments of semiconductor flash memory cells also include cells in which the tunnel layer pattern is an insulating material selected from a group consisting of silicon oxides, silicon nitrides, silicon oxynitrides and combinations thereof; the charge storage layer pattern is polysilicon; and the blocking layer pattern is an insulating material selected from a group consisting of $SiO_x/Si_xN_y/SiO_x$, $SiO_x$, $Si_xN_y$, $Al_2O_3$, $HfAlO_x$, $HfAlON$, $HfSiO_x$, $HfSiON$ and combinations thereof.

Example embodiments of semiconductor flash memory cells also include cells in which the first and second source lines extend below a primary surface of the semiconductor substrate to a junction depth $D_s$; and the first and second trench isolation structures extend below the primary surface of the semiconductor substrate to a trench depth $D_t$, wherein $D_t \geq D_s$. Example embodiments of semiconductor flash memory cells also include cells in which the semiconductor pillar extends vertically from a primary surface of the semiconductor substrate to a pillar height D2 and the semiconductor pillar has an average horizontal dimension WP, further wherein the semiconductor pillar has an aspect ratio $D2/W_p$ of at least 1. Example embodiments of the semiconductor pillar include configurations in which the semiconductor pillar is generally cylindrical, frustoconical or barrel-shaped.

Example embodiments of semiconductor flash memory devices include devices in which an array of pairs of semiconductor flash memory cells are formed on a semiconductor substrate, wherein each pair of memory cells includes a semiconductor pillar formed on the semiconductor substrate between first and second source lines; first and second charge storage structures formed on opposite side surfaces of the semiconductor pillar and configured to cooperate with the first and second source lines respectively; first and second trench isolation structures adjacent the semiconductor pillar that electrically separate the first and second charge storage structures; a first word line adjacent the first charge storage structure and a second word line adjacent the second charge storage structure; and a drain contact on an upper surface of the semiconductor pillar; a first group of pairs of semiconductor cells arranged along a first axis DR1, wherein each pair of semiconductor cells is separated from adjacent pairs of semiconductor cells by a first pitch P1; and a second group of pairs of memory cells arranged along a second axis DR2 configured at an angle θ to the first axis, wherein each of the pairs of memory cells includes a first memory cell and a second memory cell, and further wherein each of the first memory cells in the second group cooperates with a first common source line and a first word line and each of the second memory cells in the second group cooperates with a second common source line and a second word line, and further wherein each pair of memory cells in the second group is separated from adjacent pairs of memory cells by a second pitch P2 which satisfies the expression P2<P1, and further wherein each memory cell is common to only one first group and one second group.

Example embodiments of semiconductor flash memory devices include devices in which the first and second word lines have a lateral base thickness of $T_L$, wherein the expression P2<$2T_L$ is satisfied and/or in which a minimum word line vertical thickness measured adjacent the isolation structures is sufficient to prevent source line doping from entering the semiconductor substrate between adjacent pairs of the first group of pairs of semiconductor cells.

Example embodiments of methods for fabricating semiconductor flash memory devices include methods comprising: forming a semiconductor pillar on a semiconductor substrate; forming a charge storage structure on the semiconductor pillar; forming a conductive pattern over the charge storage structure; forming first and second source lines in the semiconductor substrate on opposite sides of the semiconductor pillar; forming first and second trench isolation structures, thereby separating the conductive pattern into first and second word lines and separating the charge storage structure into first and second memory cells; and forming a common bit line contact to an upper surface of the semiconductor pillar. Other example embodiments of methods for fabricating pairs of semiconductor memory cells include forming the semiconductor pillar by forming a hard mask layer on the semiconductor substrate; forming a soft mask pattern on the hard mask layer to expose a portion of the hard mask layer: etching the exposed region of the hard mask layer to form a hard mask pattern exposing a portion of the semiconductor substrate; and etching the exposed portions of the semiconductor substrate to form the semiconductor pillar.

Other example embodiments of methods of fabricating pairs of semiconductor memory cells include forming the semiconductor pillars by forming a mask layer on the semiconductor substrate; patterning and etching the mask layer to form a mask pattern having an opening that exposes a portion of the semiconductor substrate; filling the opening with an epitaxial semiconductor material; and removing the mask pattern. Other example embodiments of methods of fabricating pairs of semiconductor memory cells include removing an upper portion of the epitaxial semiconductor material to expose an upper surface of the mask pattern and form a planarized surface. Other example embodiments of methods of fabricating pairs of semiconductor memory cells include depositing a layer of an amorphous epitaxial material in the opening; treating the amorphous epitaxial material to form a single crystal structure having a crystalline orientation corresponding to that of the semiconductor substrate.

Other example embodiments of methods of fabricating pairs of semiconductor memory cells include forming the charge storage structure on the semiconductor pillar by forming a tunnel layer pattern on a side surface of the semiconductor pillar; forming a charge storage layer pattern on the tunnel layer pattern; and forming a blocking layer pattern on the charge storage layer pattern. Other example embodiments of methods of fabricating pairs of semiconductor memory cells include forming a tunnel layer pattern from an insulating material selected from a group consisting of silicon oxides, silicon nitrides, silicon oxynitrides and combinations thereof; forming a charge storage layer pattern from a material selected from a group consisting of $Si_xN_y$, $Al_2O_3$, $HfAlO_x$, HfAlON, $HfSiO_x$, HfSiON and combinations thereof; and/or forming a blocking layer pattern is formed from an insulating material selected from a group consisting of $SiO_x$, $Si_xN_y$, $Al_2O_3$, $HfAlO_x$, HfAlON, $HfSiO_x$, HfSiON and combinations thereof.

Other example embodiments of methods of fabricating pairs of semiconductor memory cells include forming the conductive pattern over the charge storage structure by depositing a layer of a conductive material selected from a group consisting of TaN, NiTa, Ti, TiN, Ta, W, WN, Hf, Nb, Mo, $Ru_2O$, $Mo_2N$, Ir, Pt, Co, Cr and alloys thereof, polysilicon, and combinations thereof; and removing a portion of the layer of conductive material using a blanket etch to form a conductive sidewall structure on an outer surface of the charge storage structure. As will be appreciated, the "thickness" of the sidewall structure may vary in a vertical direction. Other example embodiments of methods of fabricating pairs of semiconductor memory cells include forming the charge storage layer pattern from polysilicon. Other example embodiments of methods of fabricating pairs of semiconductor memory cells include forming the conductive pattern by forming a doped polysilicon layer with a quantity of a dopant sufficient to alter a work function by at least 0.2 eV relative to a work function obtained with undoped polysilicon.

Other example embodiments of methods of fabricating pairs of semiconductor memory cells include forming an array of semiconductor pillars on a semiconductor substrate; forming a charge storage structure on each of the semiconductor pillars; forming a conductive pattern of conductive elements and spaces to define first groups of charge storage structures, wherein each first group is arranged along an axis parallel to an axis DR1 and each member of each first group shares a single conductive element; forming first and second source lines in the semiconductor substrate between adjacent conductive elements; forming first and second trench isolation structures, thereby separating each of the conductive patterns into first and second word lines and separating each of the charge storage structures into first and second memory cells; forming a common bit line contact to an upper surface of the semiconductor pillar; and forming common bit lines for electrically connecting second groups of first and second memory cells arranged along an axis parallel to a second axis DR2, wherein each memory cell is common to only one first group and one second group.

Other example embodiments of methods of fabricating pairs of semiconductor memory cells include structures wherein each first group aligned along a single axis is separated from adjacent first groups aligned along parallel axes by a pitch P1; and each pillar in a first group is separated from adjacent pillars within the first group by a pitch P2, wherein P1>P2.

Other example embodiments of methods of fabricating pairs of semiconductor memory cells include forming the conductive pattern by forming a conformal conductive layer having a thickness $T_0$; etching the conductive layer using an anisotropic etch to form sidewall structures having a lateral base thickness of $T_L$, wherein P2<$2T_L$. Other example embodiments of methods of fabricating pairs of semiconductor memory cells include maintaining a minimum conductive pattern thickness measured between adjacent semiconductor pillars at no less than 50% of $T_0$.

BRIEF DESCRIPTION OF THE DRAWINGS

Example embodiments described below will be more clearly understood when the detailed description is considered in conjunction with the accompanying drawings, in which.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Figures 1A, 1B:
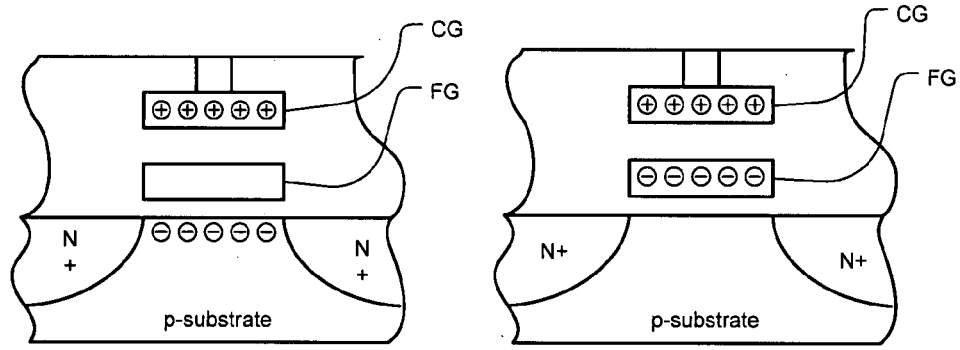
FIGS. 1A-1D illustrate an example embodiment of a floating gate structure in both initial (unprogrammed) and programmed states.
Figures 1C, 1D:
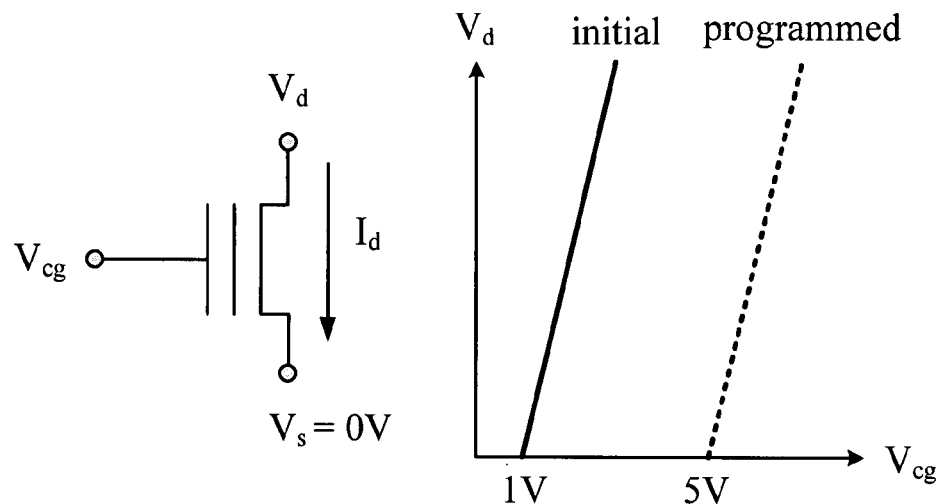

As illustrated in FIGS. 1A and 1B, a basic flash memory cell includes a transistor, for example, an n-channel transistor, in which the control gate CG is separated from the substrate channel region by a floating gate FG. In the initial or unprogrammed state, the floating gate FG is relatively uncharged in comparison to the control gate and substrate. Accordingly, the floating gate FG has a reduced influence on the electric field induced in the channel region through application of a voltage to the control gate. The flash memory cell is programmed by establishing a voltage differential sufficient to cause electrons from the substrate to be injected through the insulating material and accumulate on the floating gate FG via hot carrier injection (HCI) for a NOR flash memory device and F-N tunneling for a NAND flash memory device. As illustrated in FIG. 1C, a voltage $V_{cg}$ is then applied to the control gate CG and the current $I_d$ through the device from the drain, maintained at $V_d$, and the source, typically maintained at a $V_s$ of 0V, is monitored. As reflected in FIG. 1D, the electrons added to the floating gate FG during the programming operation increases the threshold voltage ($V_t$), in this case, $V_{cg}$, required to obtain similar current through the device, a difference that can be sensed to read the memory cell and determine whether it held a "1" or a "0." The flash memory devices can be erased by removing electrons from the floating gate FG by establishing an electrical field sufficient to induce F-N tunneling in both NOR and NAND flash memory devices.

Figure 2A:
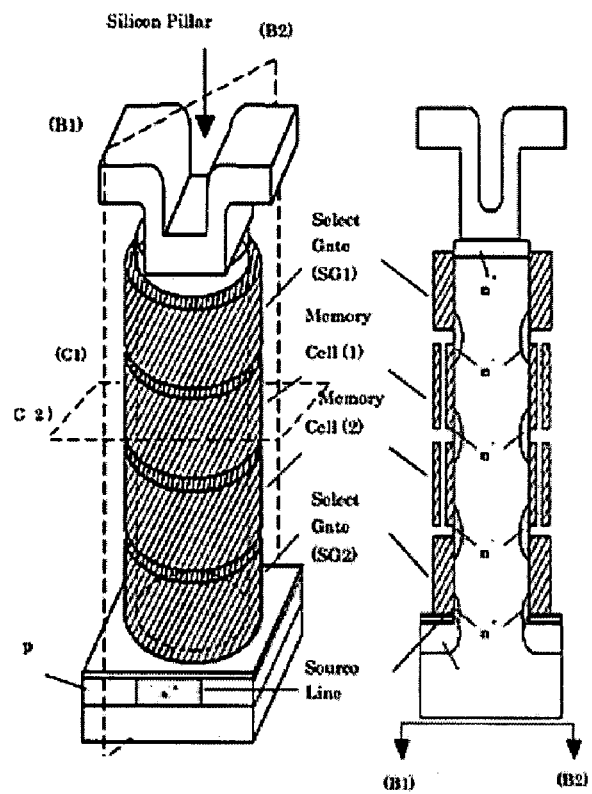
FIGS. 2A-2C illustrate a conventional floating gate structure.
Figure 2B:
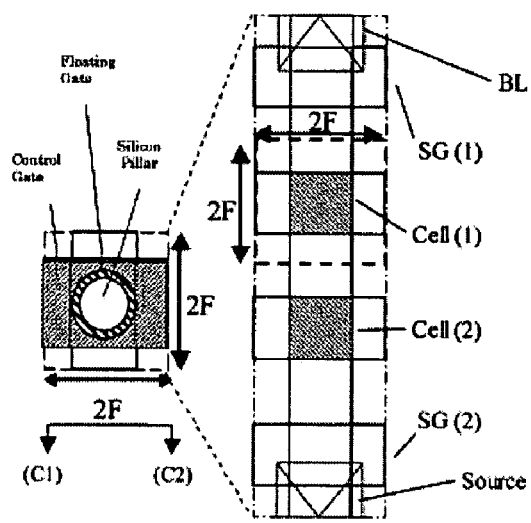
Figure 2C:
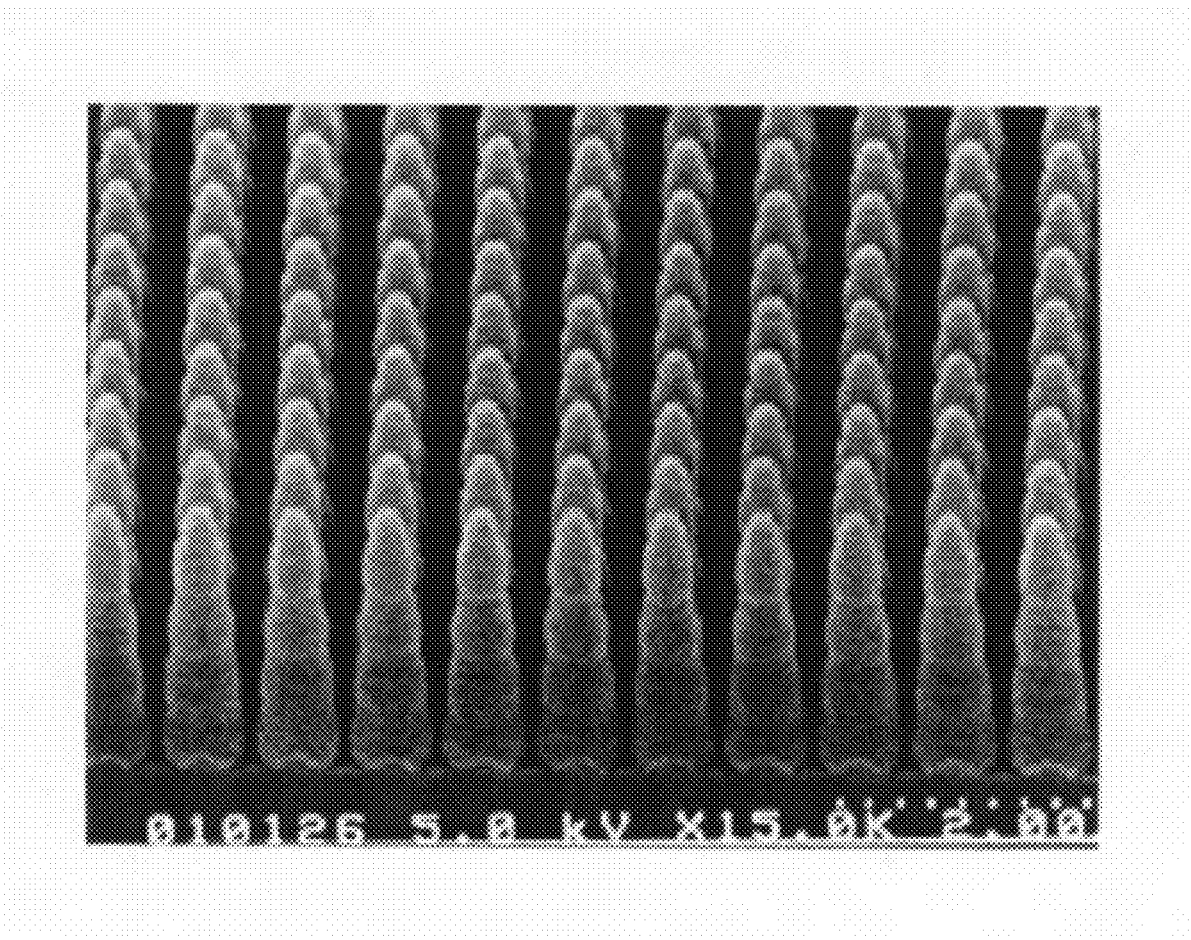

As the number of portable electronics devices and the number of users of such devices continues to increase, the need for flash memory devices exhibiting improved performance, increased density and/or reduced manufacturing costs has also continued to increase. One way to achieve reduced manufacturing costs, particularly as measured by cost per bit, is by reducing the memory cell size. Various techniques have been utilized for reducing the memory cell size including, for example, utilizing self-aligned floating gates, self-aligned STI structures and/or scaled and/or higher performance dielectrics. Such techniques, however, are reaching limitations in their ability to achieve further reductions in memory cell size. Other efforts have focused on utilizing three-dimensional structures, including for example stacked-surrounding gate transistors as illustrated in FIGS. 2A-2C as taught by Masuoka et al. for NAND flash devices.

Figure 3:
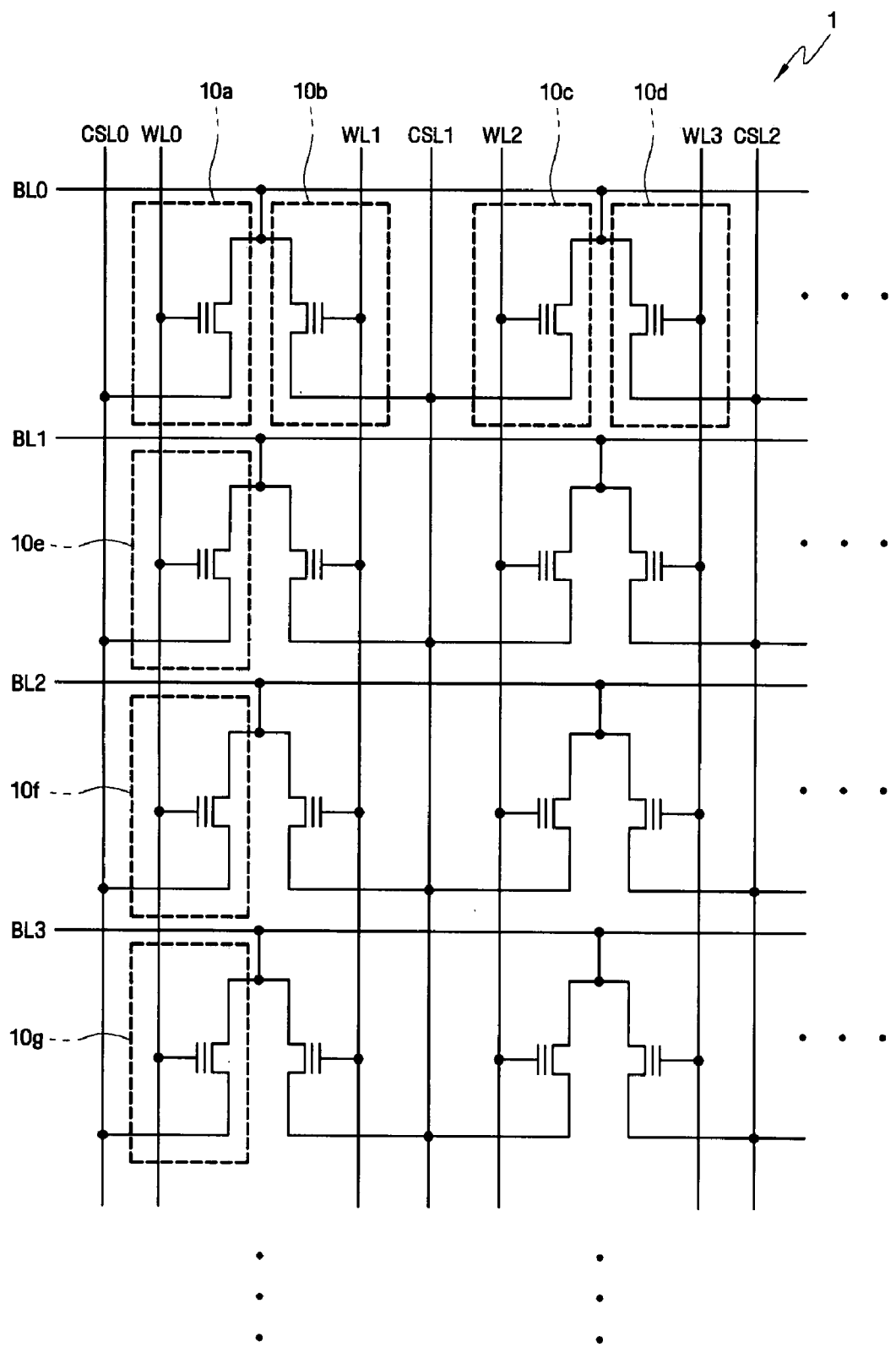
FIG. 3 is a schematic representation of a memory array according to example embodiments of the disclosure.

Example embodiments of NOR flash memory devices may include a plurality memory cells (10a-10g), as illustrated in the schematic provided in FIG. 3, with each memory cell in a first group (10a, 10e, 10f, 10g) having a control gate that is, in turn, connected to a corresponding word line (WL0-WL3) aligned in a first direction, and a plurality of drain nodes provided on a second group of memory cells (10a, 10b, 10c, 10d) that are, in turn, connected to a corresponding plurality of bit lines (BL0-BL3) aligned in a second direction, the first and second directions typically being offset by about 90°. The first group of memory cells also includes a plurality of source nodes that are connected to a corresponding common source line (CSL0~CSL2) that is also aligned in the first direction.

Figure 4:
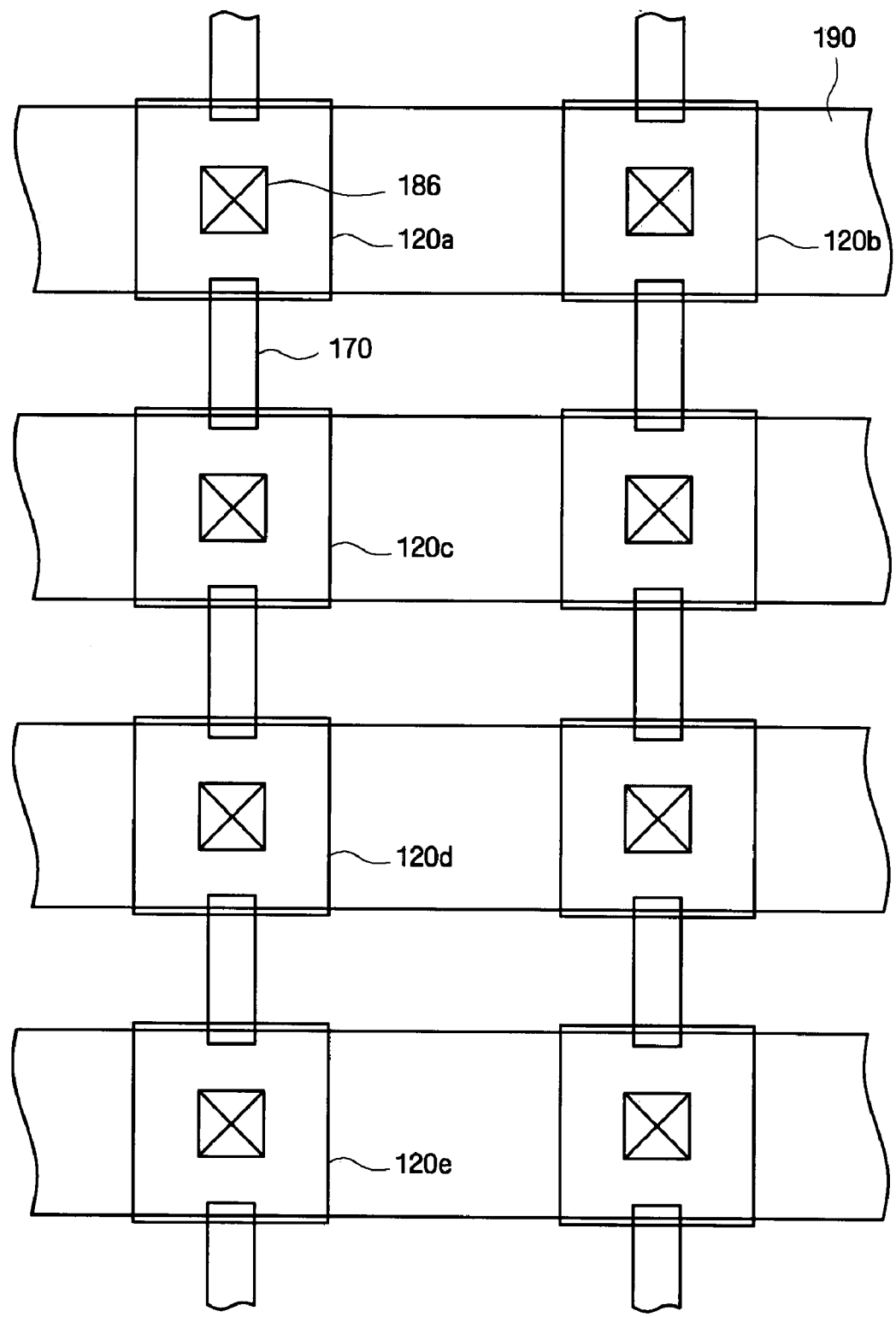
FIG. 4 is a plan view of a memory array according to example embodiments of the disclosure.

FIG. 4 provides a plan view of example embodiments of elements forming a flash memory array generally corresponding to the schematic of FIG. 3. As illustrated in FIG. 4, example embodiments will include a plurality of semiconductor pillars (120a, 120b, 120c, 120d, 120e (collectively 120)), isolation trench structures 170 being provided between semiconductor pillars aligned in the first direction, contacts 186 provided to an upper surface of each of the semiconductor pillars and third conductive lines 190 extending over the contacts in the second direction. The pitch P1 between semiconductor pillars (120a, 120c, 120d, 120e) aligned in the first direction and the pitch P2 between semiconductor pillars (120a, 120b) aligned in the second direction will satisfy the expression P2≧P1 with P2 typically being greater than P1.

Figure 5:
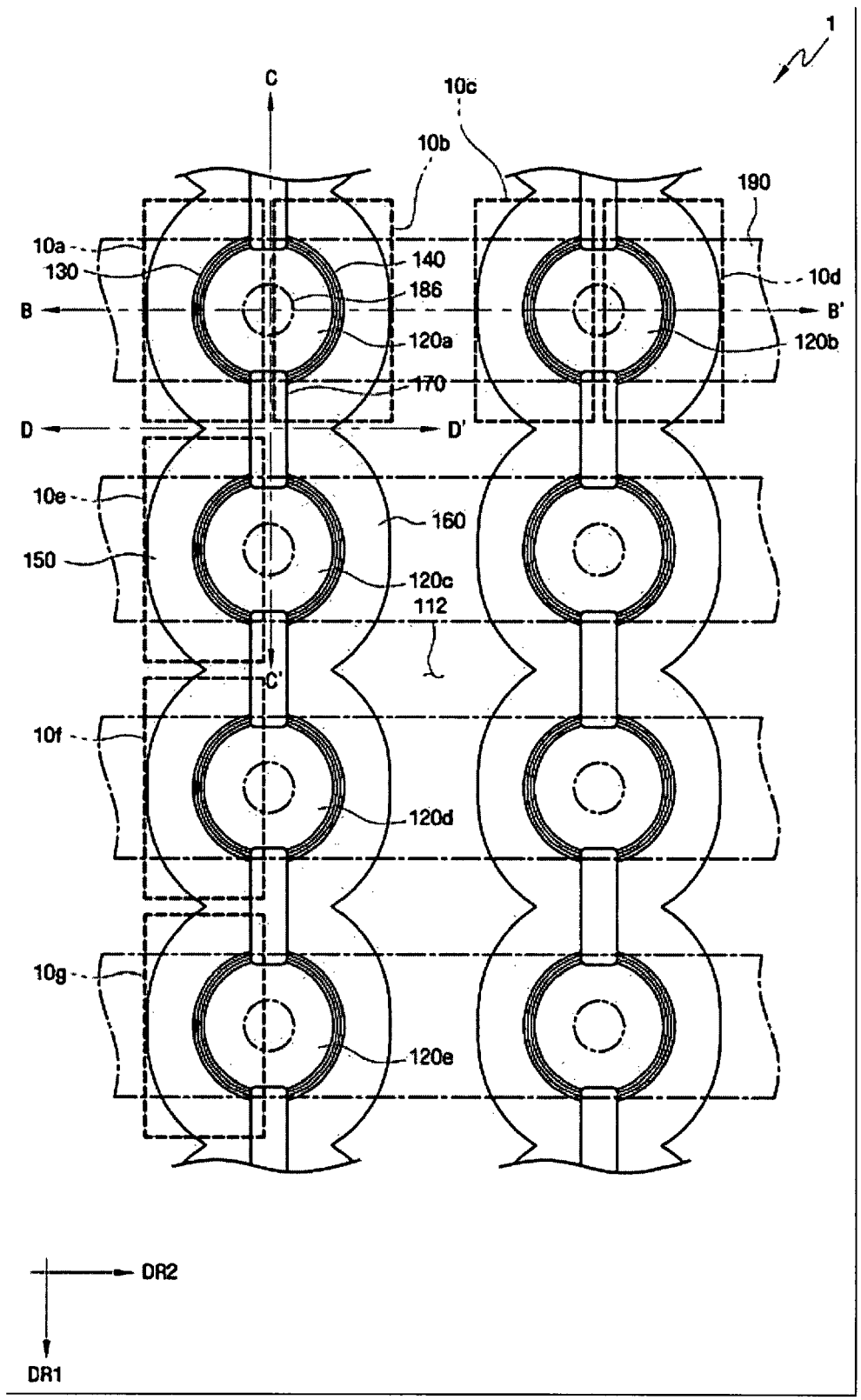
FIG. 5 is a plan view of a memory array according to example embodiments of the disclosure.

As illustrated in FIG. 5, a memory cell array 1 according to example embodiments includes the plurality of semiconductor pillars 120 corresponding to FIG. 4, a first conductive line 150, a second conductive line 160 (first and second word lines), a first junction area 112 (for connection to a common source line), a second junction area formed in the upper portion of the semiconductor pillars (for connection to drain regions), a first charge storage element 130 and a second charge storage element 140 (floating gate structures), isolation trench structures 170 separating the first and second charge elements formed on opposite sides of the semiconductor pillars 120, a contact 186 to each semiconductor pillar and a third conductive line 190 for establishing electrical contact to the semiconductor pillars through the corresponding contact. Also on FIG. 5 are indicated a series of planes B-B', C-C' and D-D' along which cross-sectional views will be taken to illustrate additional aspects of the structure according to example embodiments.

Figure 6:
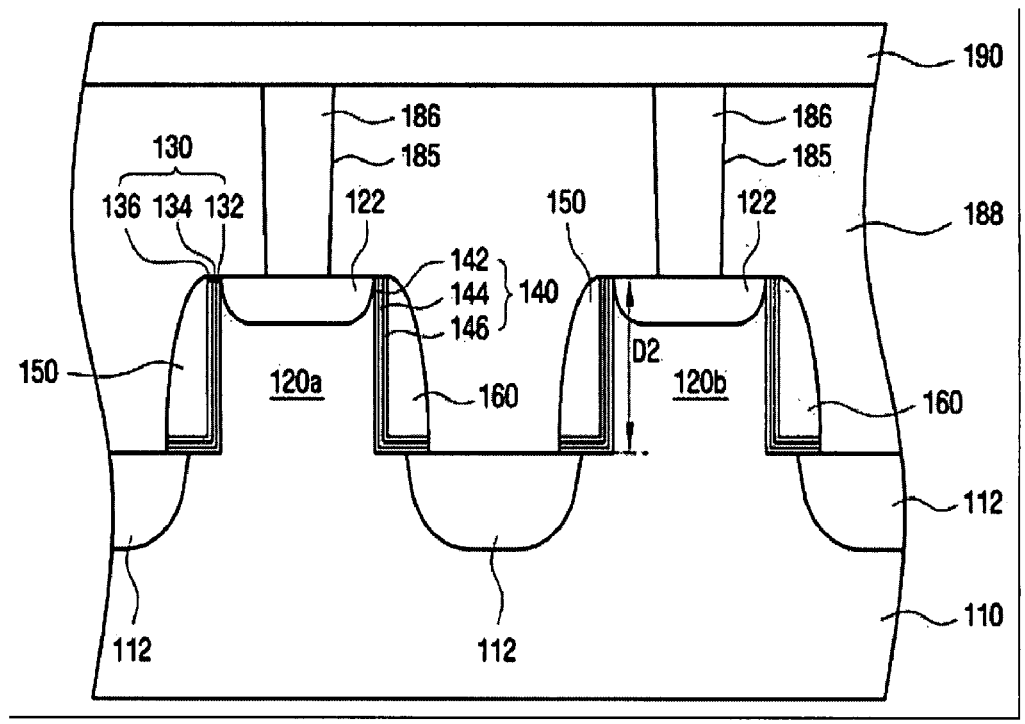
FIG. 6 is a cross-sectional view of a memory array as illustrated in FIG. 5 taken along a plane B-B'.

FIG. 6 illustrates a cross-sectional view taken across the memory cells associated with two semiconductor pillars 120a, 120b aligned in the second direction along the plane indicated by line B-B' shown in FIG. 5. As illustrated in the FIG. 6, example embodiments include a semiconductor substrate 110, first and second semiconductor pillars 120a, 120b projecting from the semiconductor substrate by a pillar height D2, a first junction area 112, first and second conductive lines 150, 160, first and second charge storage elements 130, 140, a second junction areas 122 formed in the upper portions of the semiconductor pillars, an interlayer dielectric 188 separating the substrate 110 and the third conductive line 190, a contact opening 185 and conductive material 186 filling the contact opening for establishing electrical contact between the third conductive line and the second junction areas 122. Each of the charge storage elements 130, 140 further comprises a tunnel layer 136, 142, a charge storage layer 134, 144 and blocking layer 132, 146.

The tunnel layer pattern 136, 142 may have a thickness from 30 to 100 Å and may be formed from an insulating material selected from a group consisting of $SiO_2$, SiON and combinations and mixtures thereof. The charge storage layer pattern 134, 144 may also have a thickness of from 30 to 100 Å and may be formed from a conductive material comprising a conductor material with dot shaped insulator regions and a charge trap layer. The charge trap layer may be formed from a material selected from a group consisting of $Si_xN_y$, $Al_2O_3$, $HfAlO_x$, HfAlON, $HfSiO_x$, HfSiON and mixtures and combinations, for example, a multi layer composite structure. The blocking layer pattern may have a thickness of from 50 to 150 Å and may be formed from a material selected from a group consisting of $SiO_x/Si_xN_y/SiO_x$ (ONO), $SiO_x$, $Si_xN_y$, $Al_2O_3$, $HfAlO_x$, HfAlON, $HfSiO_x$, HfSiON and combinations and mixtures thereof.

Figure 7:
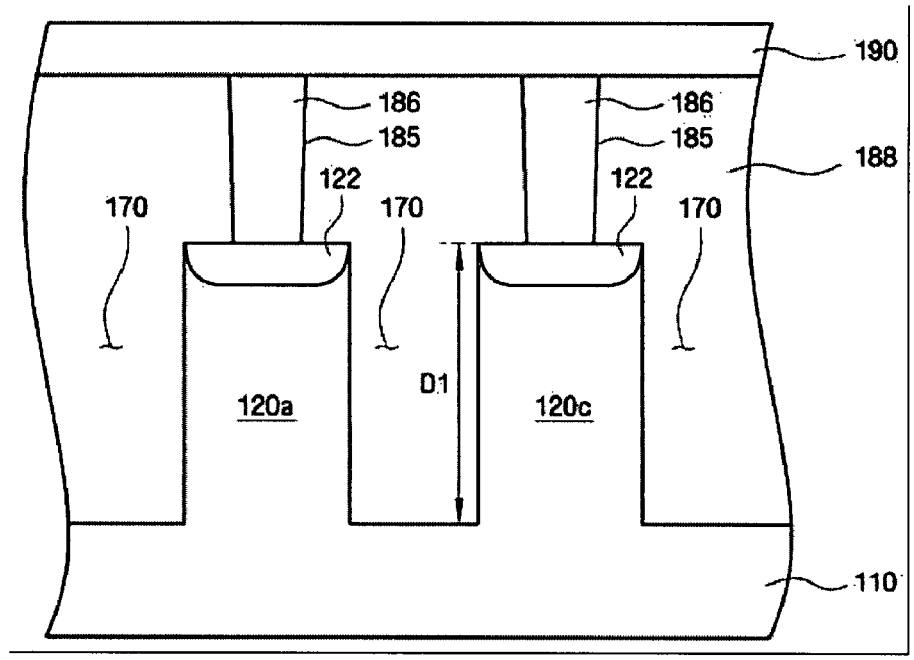
FIG. 7 is a cross-sectional view of a memory array as illustrated in FIG. 5 taken along a plane C—C'.

FIG. 7 illustrates a cross-sectional view taken across the memory cells associated with two semiconductor pillars 120a, 120c aligned in the first direction along the plane indicated by line C-C' shown in FIG. 5. As illustrated in the FIG. 7, example embodiments include a semiconductor substrate 110, first and second semiconductor pillars 120a, 120c projecting from the semiconductor substrate, with the semiconductor pillars being separated by an isolation trench 170 having a depth D1.

As shown in FIG. 7, example embodiments also include second junction areas 122 formed in the upper portions of the semiconductor pillars, an interlayer dielectric 188 separating the substrate 110 and the third conductive line 190, a contact opening 185 and conductive material 186 filling the contact opening for establishing electrical contact between the third conductive line and the second junction areas 122. The first and second conductive lines and the first and second charge storage elements (not shown) provided on opposite sides of the semiconductor pillars are separated by the isolation trench. As will be appreciated by those skilled in the art, the substrate 110 need not be limited to semiconductor materials, but may incorporate one or more materials from a group consisting of silicon, SOI (silicon on insulator), GaAs, SiGe, quartz and glass.

Figure 8:
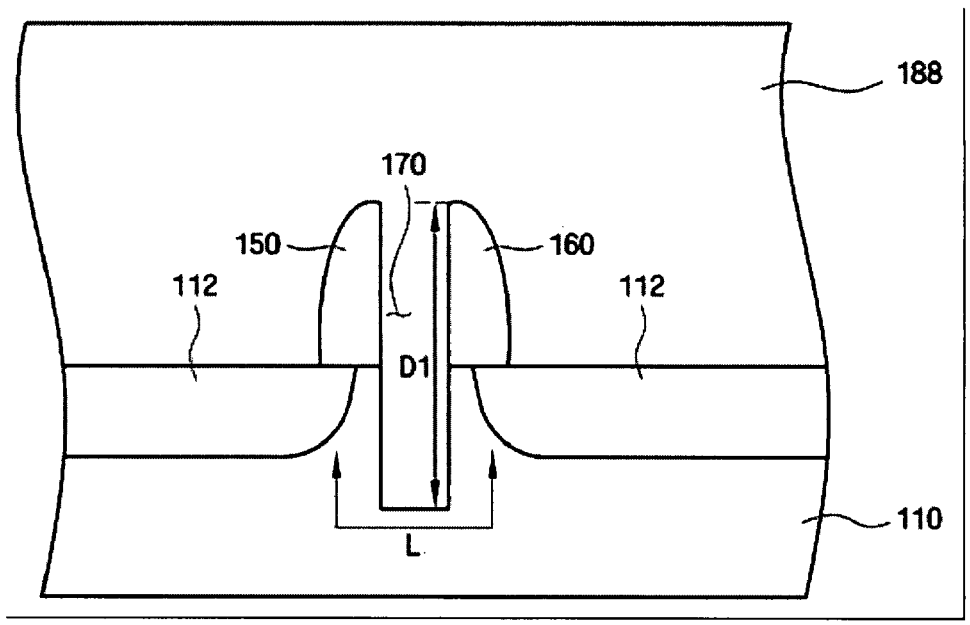
FIG. 8 is a cross-sectional view of a memory array as illustrated in FIG. 5 taken along a plane D-D'.

FIG. 8 illustrates a cross-sectional view taken between the memory cells associated with two semiconductor pillars 120a, 120c aligned in the first direction along the plane indicated by line D-D' shown in FIG. 5. As illustrated in the FIG. 8, example embodiments include a semiconductor substrate 110, an isolation trench 170 having a depth D1. Although illustrated for convenience with a generally rectangular configuration, as will be appreciated by those skilled in the art, the profile of the isolation trench need not be particularly limited and may include other geometric configurations including, for example, rounded, oval, hexagonal and complex profiles. As illustrated in the FIG. 8, example embodiments include first conductive lines 150 and second conductive lines 160 separated by the isolation trench, first junction areas 112 and the interlayer dielectric 188. The depth D1 of the isolation trench 170 may be greater than the height D2 of the semiconductor pillars 120. Also illustrated in FIG. 8 is a length L generally corresponding to the separation of the first junction areas 112 provided on opposite sides of semiconductor pillars aligned in the first direction.

The first and second conductive lines 150, 160 may be formed from a variety of conductive materials including polysilicon, doped polysilicon, metals and metal compounds including, for example, TaN, NiTa, Ti, TiN, Ta, W, WN, Hf, Nb, Mo, $Ru_2O$, $Mo_2N$, Ir, Pt, Co, Cr and alloys, mixtures and combinations thereof sufficient to provide the necessary conductivity and tolerate the subsequent processing to which they will be exposed. The thickness of the conductive line may be from 800 Å to 2000 Å.

Figure 9:
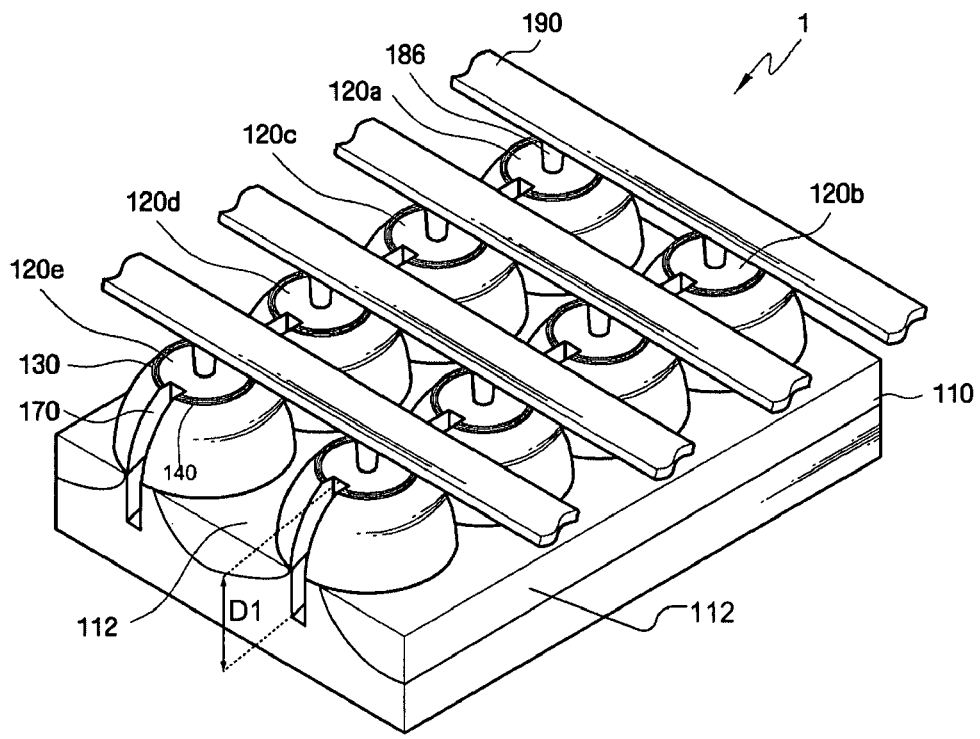
FIG. 9 is an orthogonal view of a memory array corresponding to the array as illustrated in FIG. 5.
Figure 10:
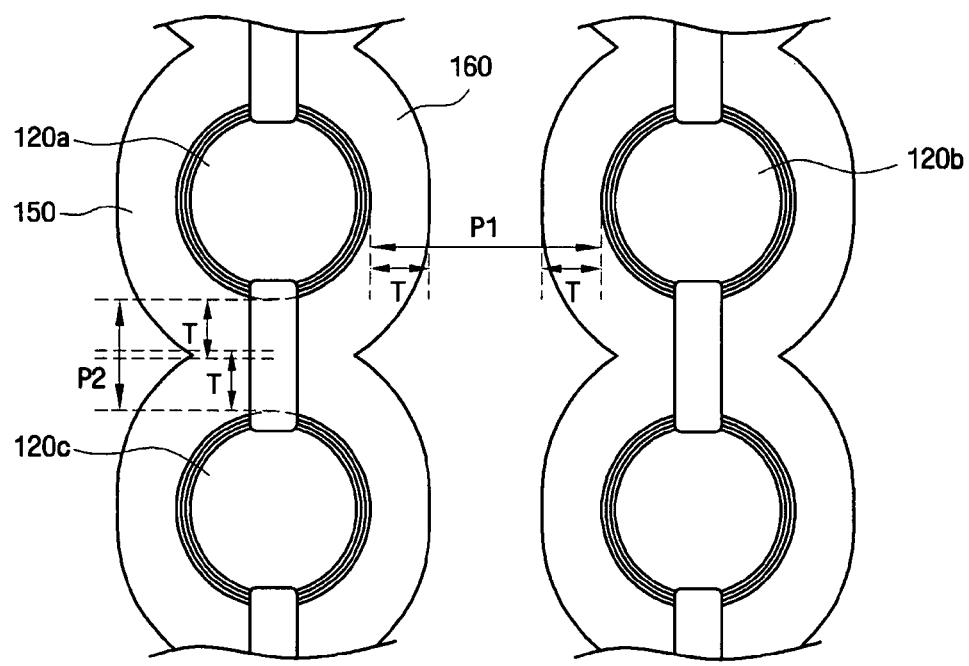
FIG. 10 is a plan view of a memory array according to example embodiments of the disclosure.

FIG. 9 illustrates an orthogonal view of a memory circuit array 1 including a 4×2 semiconductor pillar array with semiconductor pillars 120a-120e and certain associated structures with the interlayer dielectric 188 having been removed for clarity. As shown in FIG. 9, example embodiments include a substrate 110, a plurality of semiconductor pillars 120, first charge storage elements 130 arranged opposite second charge storage elements 140 on each semiconductor pillar, first conductive lines 150 arranged opposite second conductive lines 160 provided along a first group of semiconductor pillars 120a, 120c, 120d, 120e aligned in the first direction, contacts 186 providing electrical connections between a third conductor 190 aligned in the second direction and second groups of semiconductor pillars 120a, 120b aligned in the second direction FIG. 10 provides a plan view of a 2×2 section of the memory cell array illustrated in FIG. 9 including semiconductor pillars 120a-120c. As illustrated in FIG. 10, the memory cell array may be characterized by various spacings and dimensions provided and maintained between adjacent structures. These spacings and dimensions include a first pitch P1 corresponding to the minimum separation between charge storage elements provided on opposing surfaces of adjacent semiconductor pillars aligned in the second direction and a second pitch P2 corresponding to the minimum separation between charge storage elements provided on opposing surfaces of adjacent semiconductor pillars aligned in the first direction.

These spacings and dimensions include dimension T which corresponds to the thickness of the first and second conductive lines. These spacings and dimensions are selected to satisfy the expressions P1>2T, i.e., the first and second conductive lines provided on adjacent semiconductor pillars are separated by an insulating material and are not in electrical contact with one another and 2T>P1, i.e., the first and second conductive lines provided on adjacent semiconductor pillars contact each other to provide continuous conductive lines linking groups of semiconductor pillars aligned in the first direction.

As will be appreciated by those skilled in the art, the sizing, dimensions, doping levels and materials utilized in forming the flash memory array will determine, to some extent, the voltages that must be applied to the various nodes of a memory cell during the selection, programming, erasing and reading operations in order to ensure consistent operation. It is anticipated that example embodiments of flash memory cell arrays according to the descriptions provided above may be operated successfully according to the matrix provided below in TABLE 1 with reference to memory cell 10a as shown in FIG. 3 and with the substrate held at ground (0 V).

| Operation | Selected WL (WL0) | Selected BL (BL0) | CSL | Programming Method |
|---|---|---|---|---|
| Program | 8 V | 0 V | 5 V | Hot Carrier Injection (HCI) |
| Erase | −8 V | floating | 5 V | F-N Tunneling |
| Read | $V_{cc}$ | 0.5 V | 0 V | |

The voltage on the unselected bit lines, in this instance BL1-BL3, is allowed to float.

Figure 11:
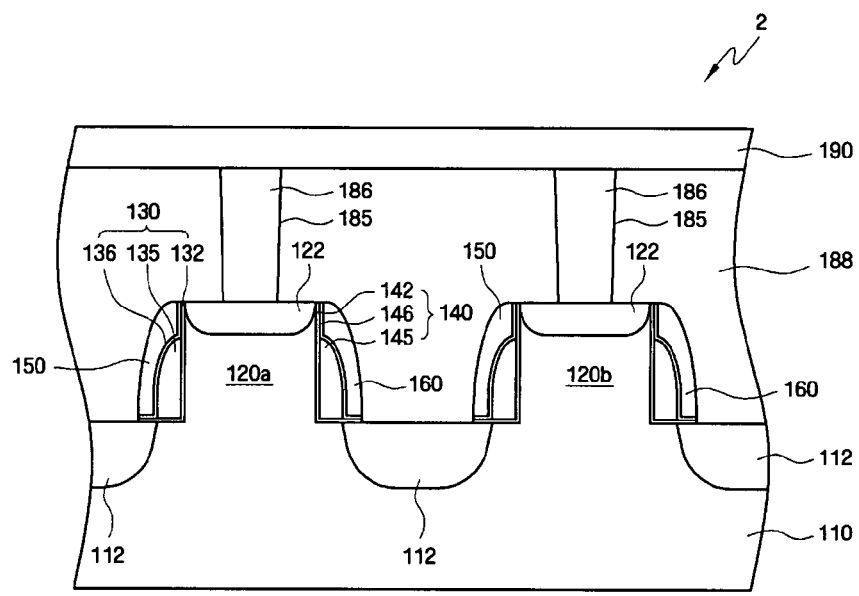
FIG. 11 is a cross-sectional view of a memory array according to another example embodiment of the disclosure.

FIG. 11 illustrates a cross-sectional view of another example embodiment generally corresponding to FIG. 6. Example embodiments according to the structure illustrated in FIG. 11 include a semiconductor substrate 110, first and second semiconductor pillars 120a, 120b projecting from the semiconductor substrate, a first junction area 112, first and second conductive lines 150, 160, first and second charge storage elements 130, 140, a second junction areas 122 formed in the upper portions of the semiconductor pillars, an interlayer dielectric 188 separating the substrate 110 and the third conductive line 190, a contact opening 185 and conductive material 186 filling the contact opening for establishing electrical contact between the third conductive line and the second junction areas 122. Each of the charge storage elements 130, 140 further comprises a floating gate 135, 145, which may be formed from polysilicon or doped polysilicon, in addition to the tunnel layer 136, 142 and blocking layer 132, 146. As suggested above, a charge trap layer may be substituted for the floating gate structure.

The tunnel layer pattern 136, 142 may have a thickness from 30 to 100 Å and may be formed from an insulating material selected from a group consisting of $SiO_2$, SiON and combinations and mixtures thereof. The blocking layer pattern 132, 146 may have a thickness of from 50 to 150 Å and may be formed from a material selected from a group consisting of $SiO_x/Si_xN_y/SiO_x$ (ONO), $SiO_x$, $Si_xN_y$, $Al_2O_3$, $HfAlO_x$, HfAlON, $HfSiO_x$, HfSiON and combinations and mixtures thereof.

Figure 12A:
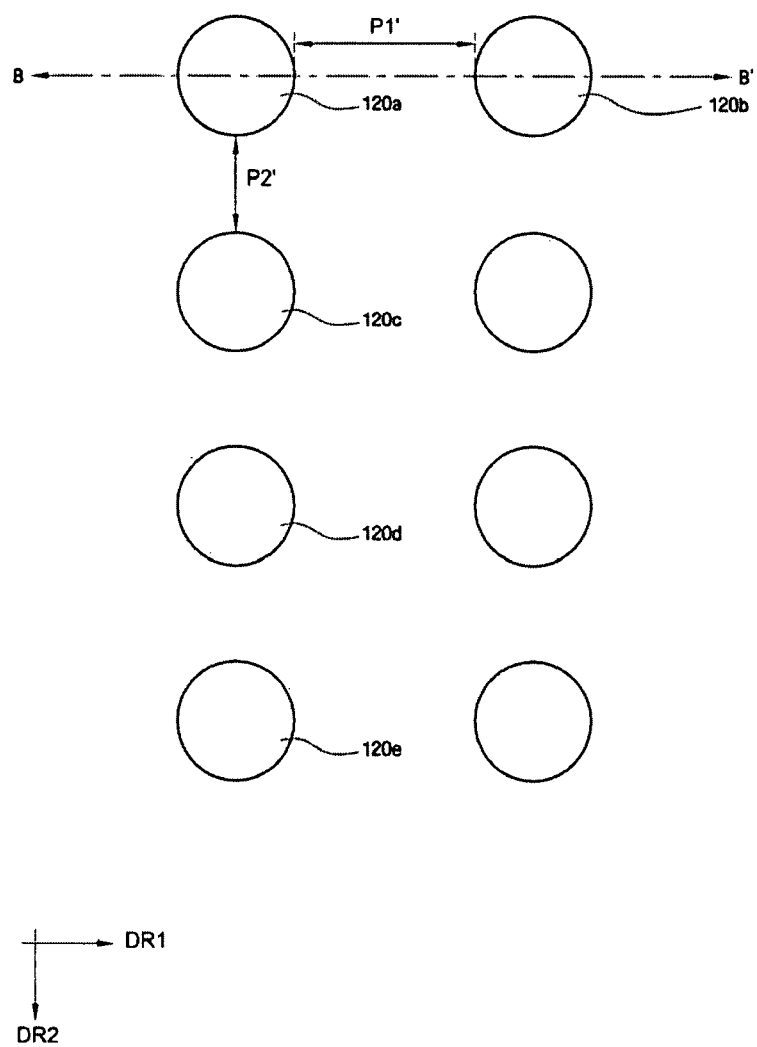
FIGS. 12A-12N and 14A-14D illustrate a method of fabricating a memory array according to example embodiments of the disclosure.
Figure 12B:
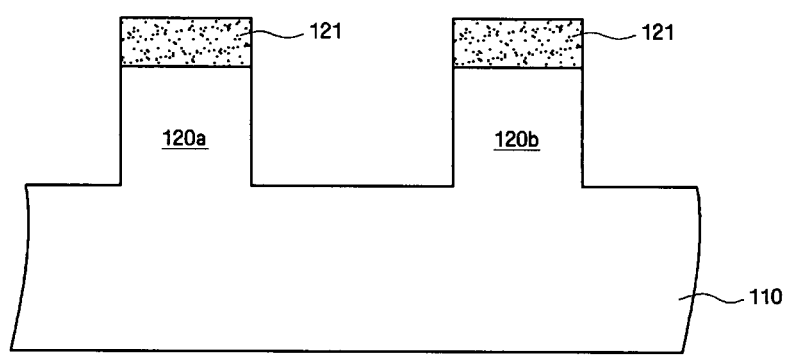
Figure 12C:
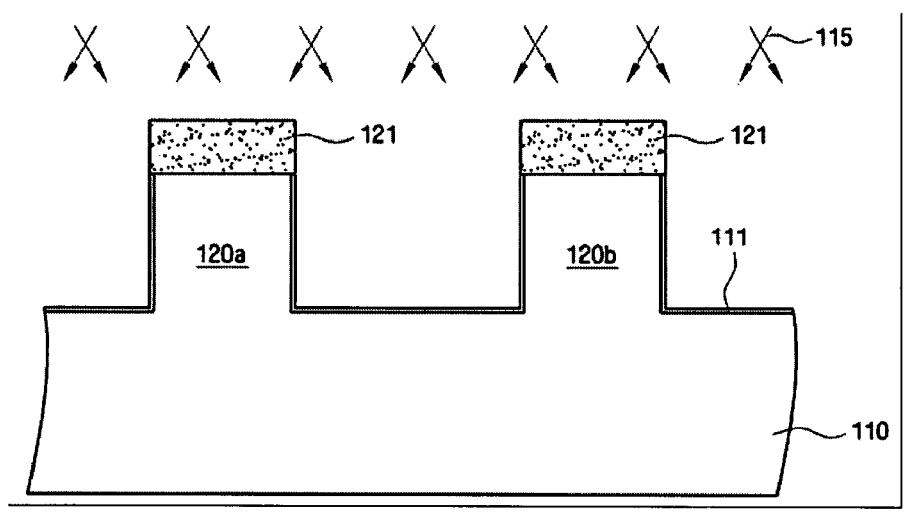
Figure 12D:
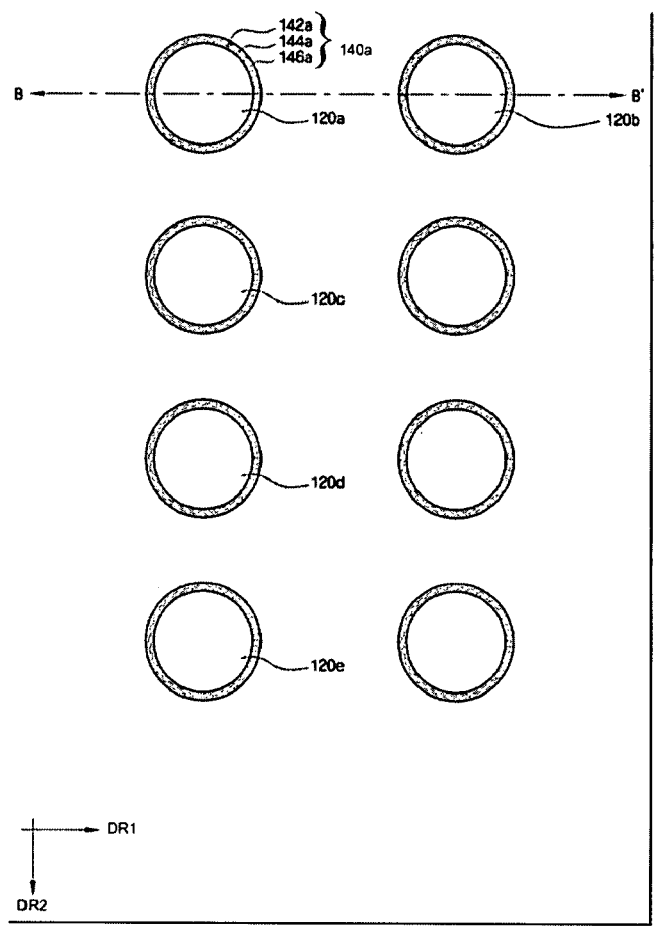
Figure 12E:
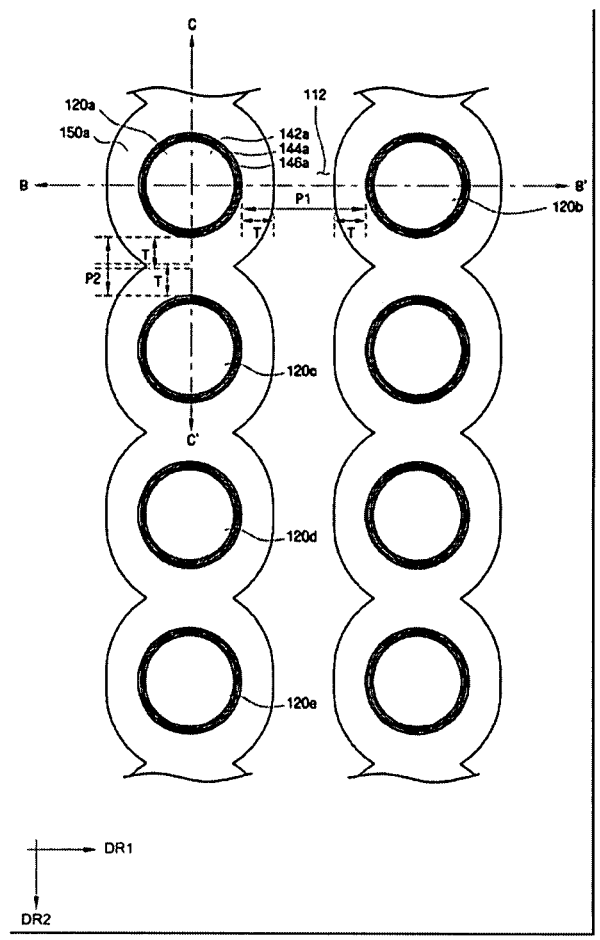
Figure 12F:
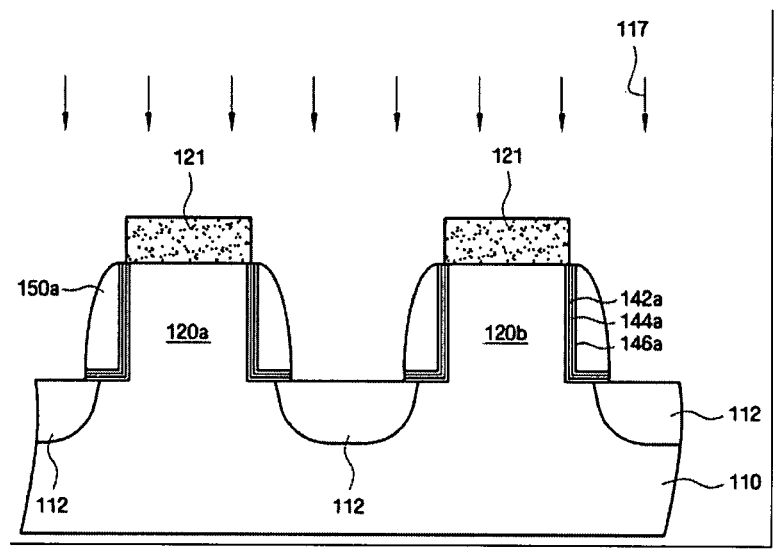
Figure 12G:
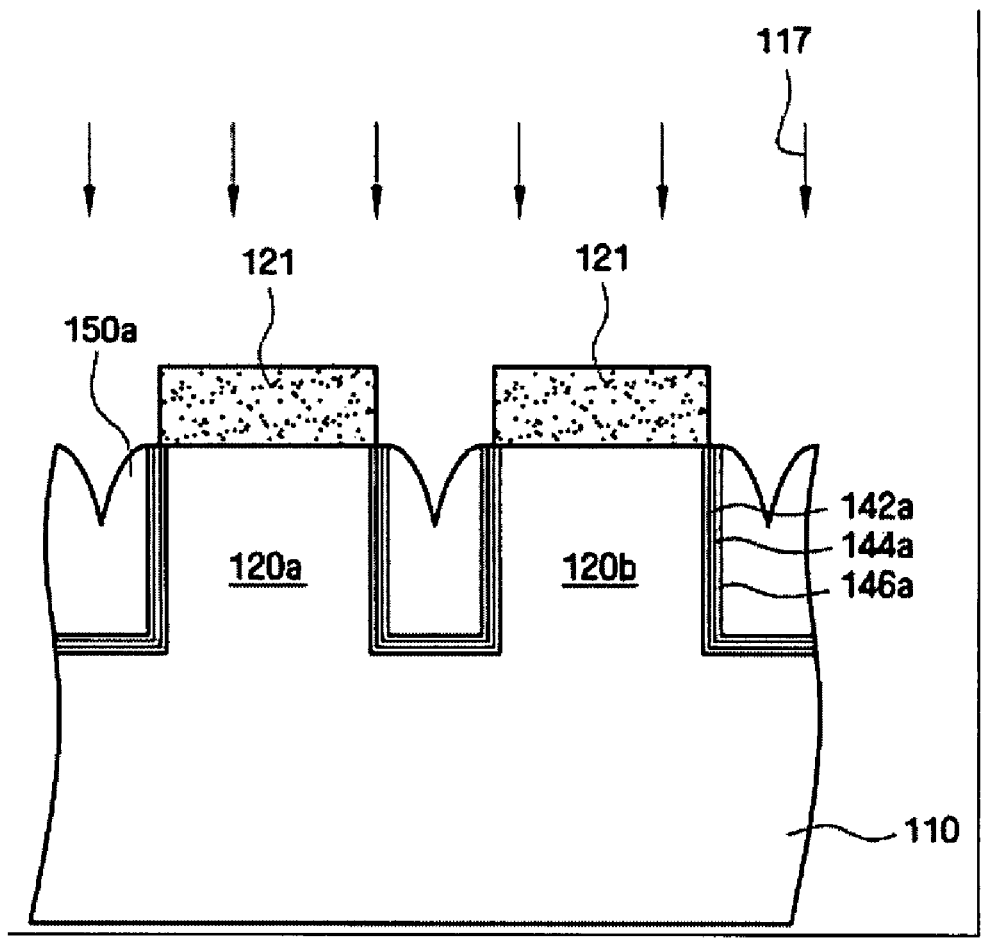
Figure 12H:
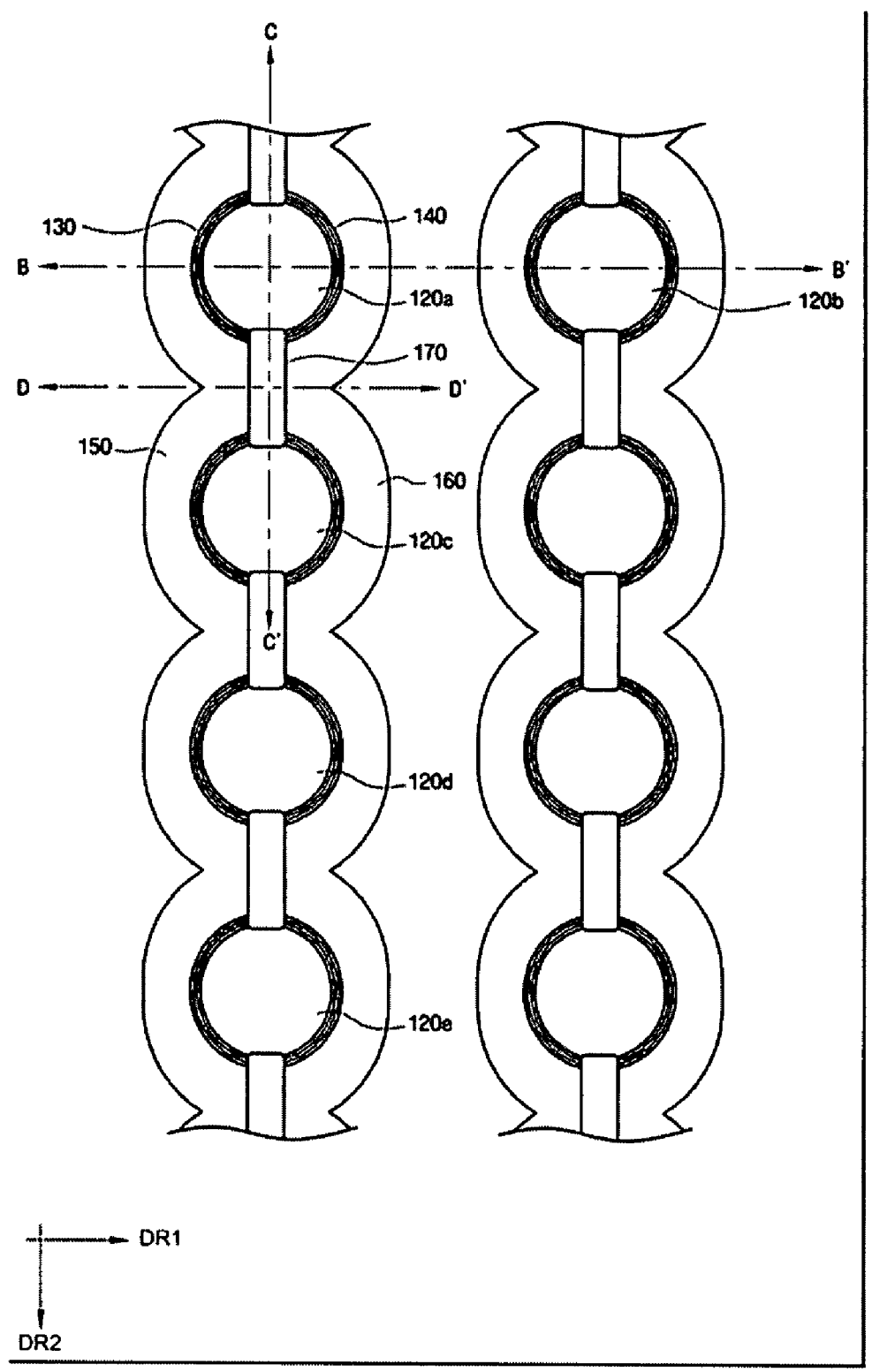
Figure 12I:
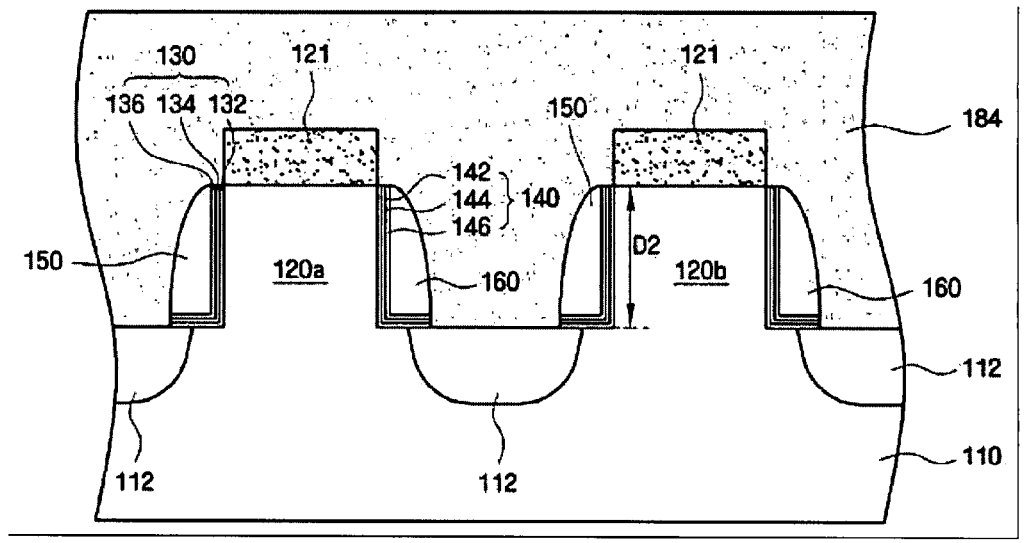
Figure 12J:
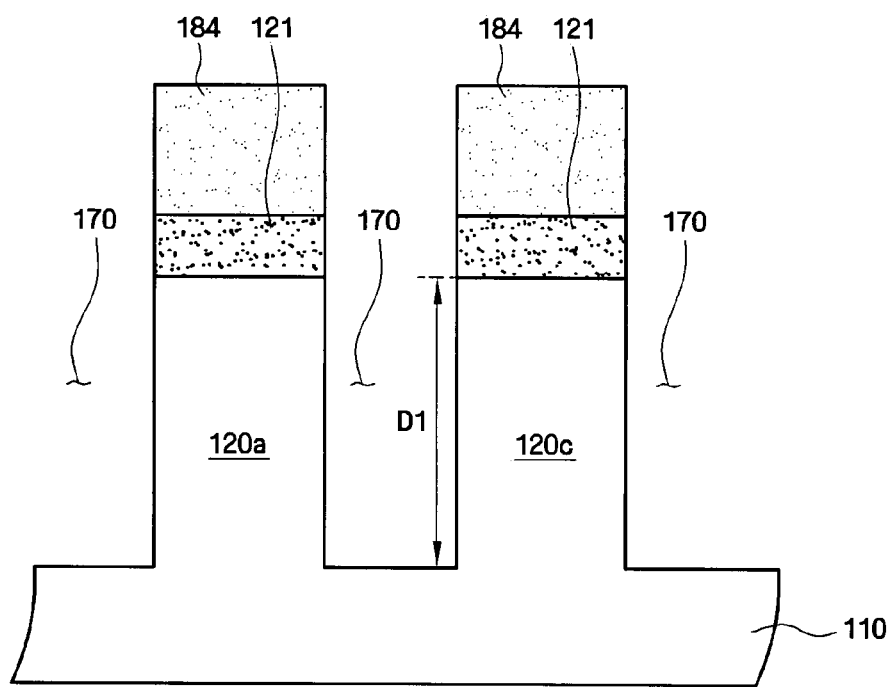
Figure 12K:
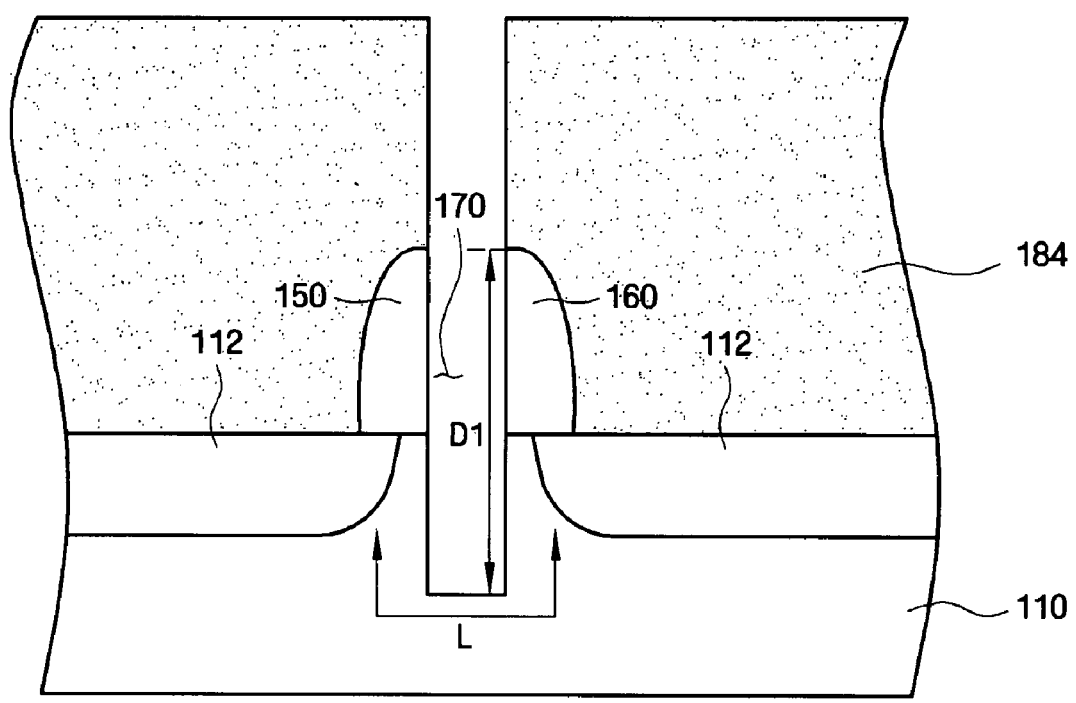
Figure 12L:
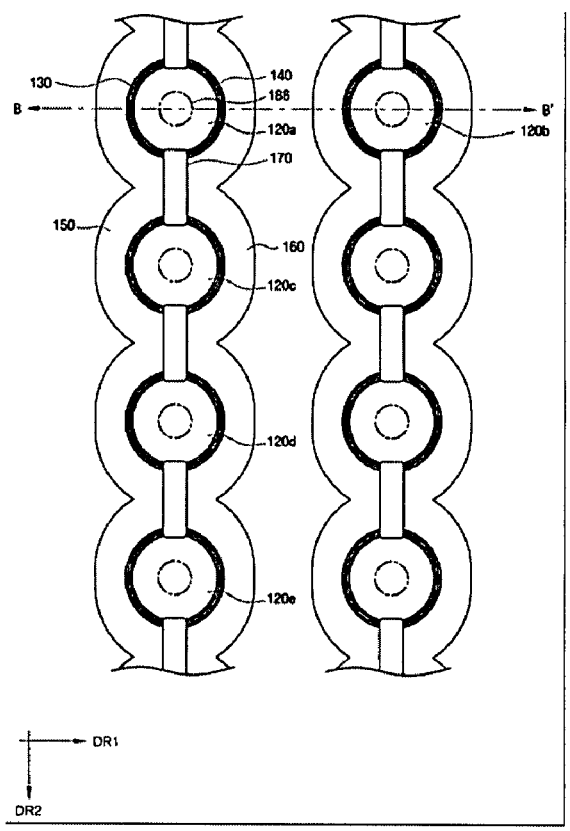
Figure 12M:
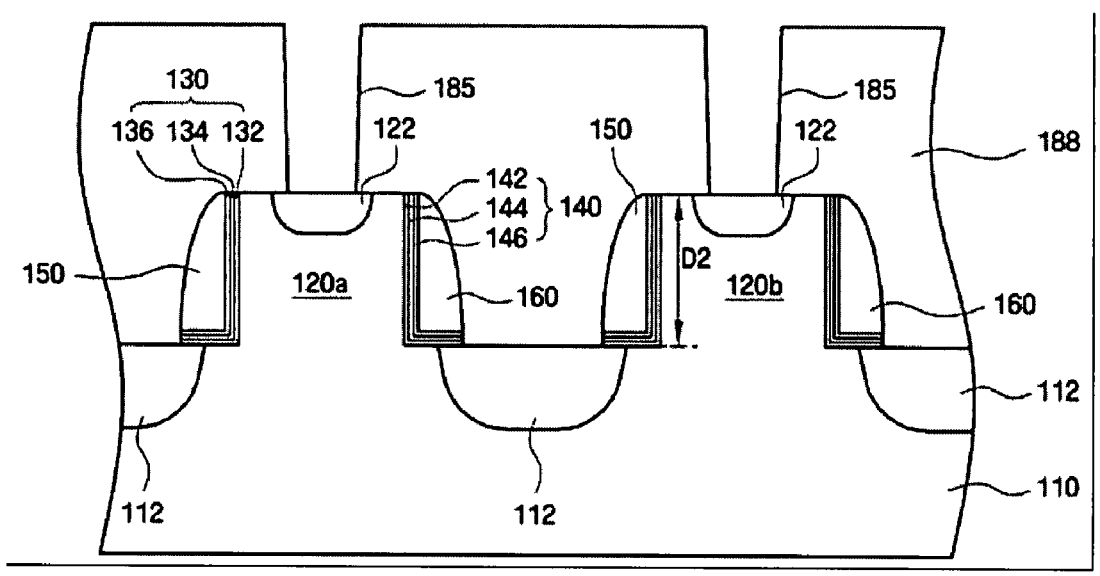
Figure 12N:
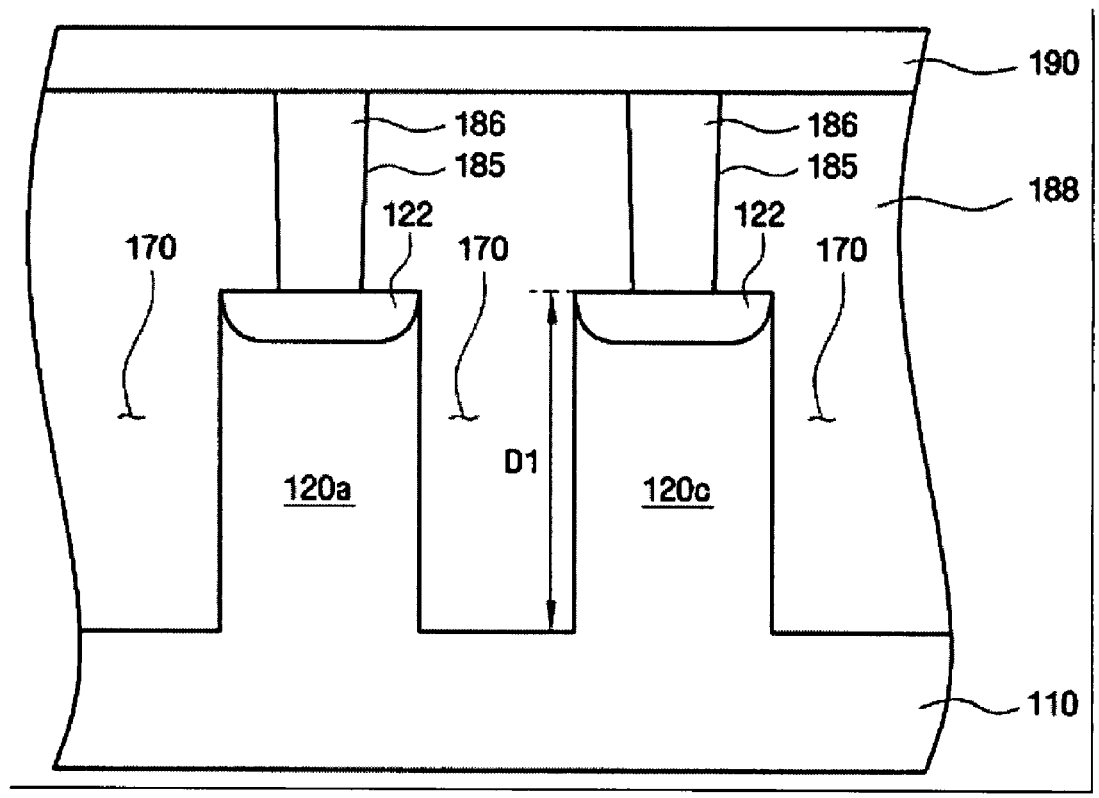

Methods of fabricating flash memory devices according to example embodiments illustrated in FIGS. 3-11 are illustrated in FIGS. 12A-12N. As illustrated in FIGS. 12A and 12B, a plurality of semiconductor pillars 120 are first formed on substrate 110 separated by a spacing P1' in a second direction, for example, along axis B-B', and by a spacing P2' in a first direction perpendicular to the second direction. The semiconductor pillars may be formed by depositing a hard mask layer, forming an appropriate photoresist pattern to expose portions of the hard mask layer, using the photoresist pattern as an etch mask to remove the exposed portions of the hard mask layer to form a hard mask pattern 121. This hard mask pattern 121 is, in turn, used as an etch mask for etching the semiconductor substrate to a depth D2, for example 500 to 5000 Å to form semiconductor pillars 120 projecting from the substrate 110.

FIGS. 14A-14D illustrate a method of forming a semiconductor pillar according to an example embodiment.

Figure 14A:
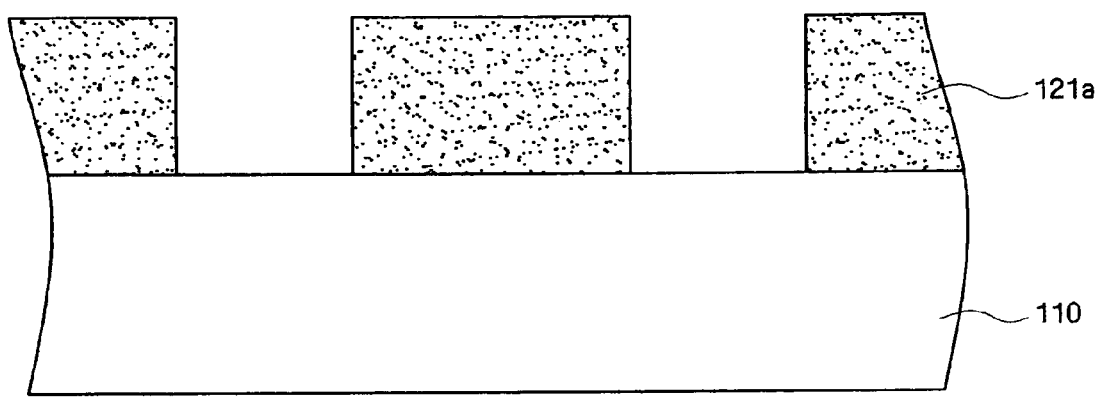

As illustrated in FIG. 14A, a mask layer (not shown) is formed on the semiconductor substrate 110. The mask layer is patterned and etched to form a mask pattern 121a having an opening that exposes a portion of the semiconductor substrate 110.

Figure 14B:
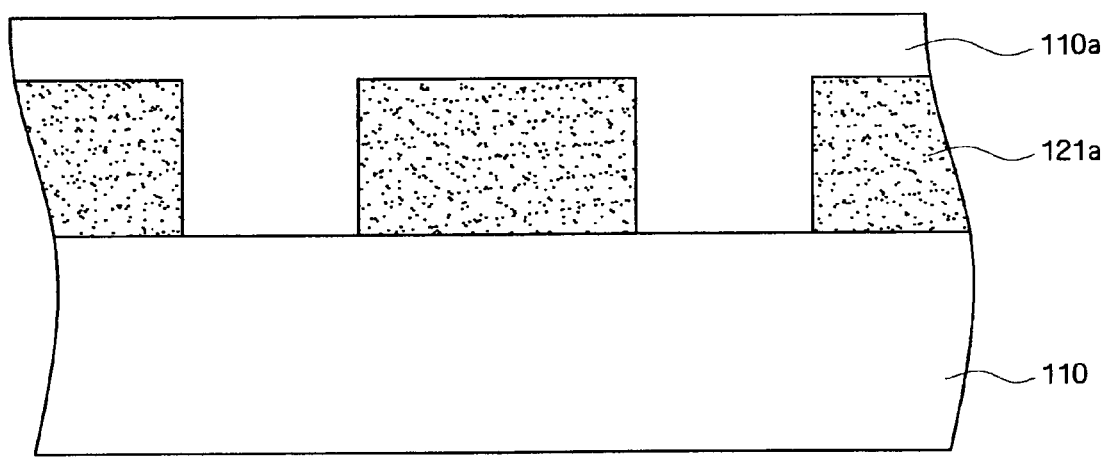

As illustrated in FIG. 14B, the opening is filled with an epitaxial semiconductor material 110a. The epitaxial semiconductor material 110a may be a layer of an amorphous epitaxial material. The amorphous epitaxial material is treated to form a single crystal structure having a crystalline orientation corresponding to that of the semiconductor substrate 110.

Figure 14C:
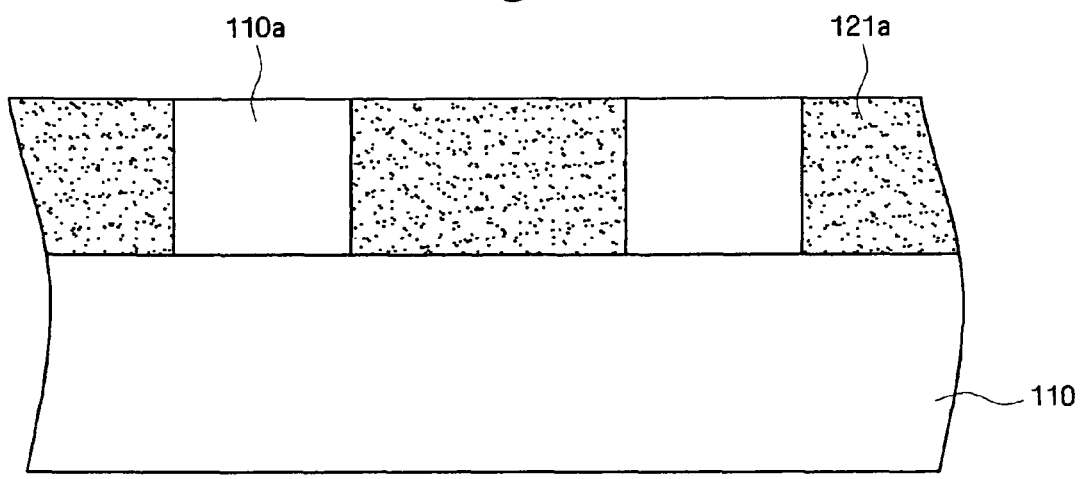

As illustrated in FIG. 14C, an upper portion of the epitaxial semiconductor material 110a is removed to expose an upper surface of the mask pattern 121a and form a planarized surface.

Figure 14D:
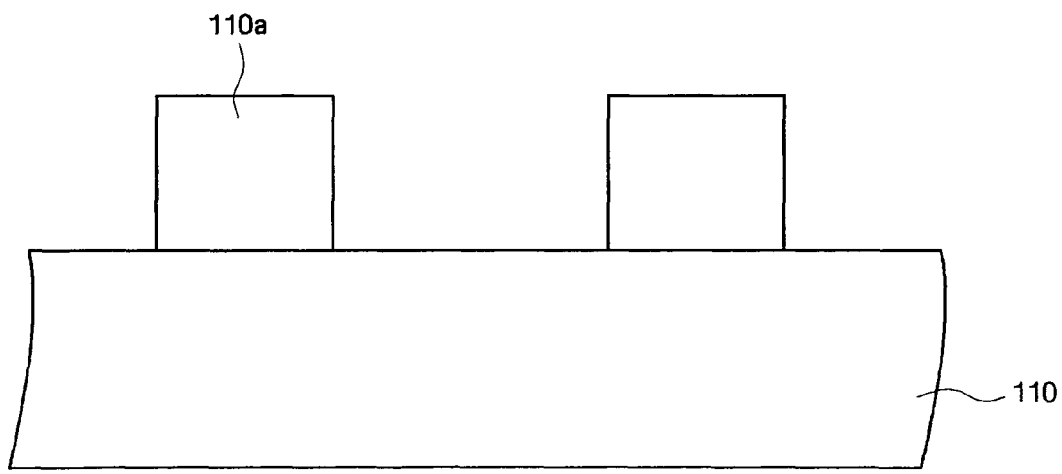

As illustrated in FIG. 14D, the mask pattern 121a is removed.

As illustrated in FIG. 12C, the etched substrate may then be processed to form a buffer insulator layer 111 comprising, for example, 20 to 30 Å of $SiO_2$, on the exposed semiconductor surfaces. The substrate 110 may then be exposed to ion implantation of a sufficient dose (or doses) of one or more p-type dopants 115 and/or additional thermal processing to form p-well structures (not shown) in upper portions of the substrate. Surface portions of the p-well structures may then be subjected to a lighter and lower energy ion implant process for the purpose of adjusting the threshold voltage. The buffer insulator layer 111 may then be removed As illustrated in FIG. 12D, the charge storage element layers 140a including a tunneling insulating layer 142a having a thickness of, for example, 30 to 50 Å, a charge storage layer 144a having a thickness of, for example, 30 to 100 Å and a blocking layer 146a having a thickness of, for example, 50 to 150 Å, collectively 140a, are then formed on the sidewalls of the semiconductor pillars 120. As illustrated in FIG. 12E, conductive line 150a is then formed on the charge storage element to, for example, a thickness of 1000 to 5000 Å. The generally horizontal thickness of the conductive line material T (or $T_L$ when measured laterally at the base of the spacer structure) and the relative spacing P1, P2 of adjacent semiconductor pillars 120 will cooperate to connect charge storage elements formed on semiconductor pillars aligned in the first direction DR1 while suppressing or preventing connections (shorts) between conductive lines provided on semiconductor pillars aligned in the second direction DR2.

As illustrated in FIG. 12F, a common source line 112 may be formed between adjacent groups of semiconductor pillars 120 aligned in the first direction DR1 by using the semiconductor pillars, the charge storage layers 142a, 144a, 146a, collectively 140a, and the conductive layers 150a and, typically, the hard mask pattern 121 as an implant mask for the ion implantation of one or more n-type dopants 117 into the exposed regions of the substrate 110. As illustrated in FIG. 12G, by maintaining P2 at a value less than 2T, the conductive material between the semiconductor pillars arranged in the first direction DR1 will block the n-type implant from reaching the underlying regions of the substrate.

As illustrated in FIG. 12F, the conductive line 150a surrounding the semiconductor pillars 120 may be formed by depositing one or more layers of one or more conductive materials to obtain a generally conformal conductive layer. This generally conformal conductive layer may then be subjected to an etch back process (also referred to as a blanket etch) to form conductive sidewall spacer structures.

As illustrated in FIGS. 12H-12K, the isolation trench 170 may then be fabricated by forming a photoresist pattern 184 on the existing structure to expose portions of the charge storage element 140a and the conductive line 150a between adjacent semiconductor pillars aligned in the first direction DR1. Using this photomask pattern 184 as an etch mask, the isolation trench 170 may be formed by multiple etch steps selected to remove the underlying materials which may include, for example, polysilicon and/or other conductive materials 150a, the blocking oxide layer 146a, the charge storage layer 144a, for example, SiN, and the tunneling oxide layer 142a. The depth of the isolation trench 170 may be selected to extend into the substrate 110 to a point below the lowest portion of the semiconductor pillars 120 in order to improve the device's resistance to punch through between the first junction areas 112 on opposite sides of the isolation trench. The isolation trench 170 separates the materials applied to opposite sides of each of the semiconductor pillars 120, thereby forming the separate first and second conductive lines 150, 160 and the separate first and second charge storage elements 130, 140 as discussed above.

As illustrated in FIGS. 12L-12N, example embodiments of the flash memory cell arrays may be completed by removing the isolation trench mask pattern 184 and hard mask pattern 121. An interlayer dielectric (ILD) 188 may then be deposited on the remaining structure. A photoresist pattern (not shown) may then be formed on the interlayer dielectric 188 to expose those regions in which contacts are to be formed to the semiconductor pillars 120. Using the photoresist pattern as an etch mask, the exposed portions of the interlayer dielectric 188 are removed to open a plurality of contact holes 185 that expose regions on the upper surfaces of the semiconductor pillars 120.

Using the remaining interlayer dielectric 188 as an implant mask, the exposed portions of the semiconductor pillars 120 may be implanted with one or more n-type dopants, and typically subjected to thermal processing to activate the dopant(s), to form second junction areas 122 in the upper portions of the semiconductor pillars. The contact holes 185 may then be filled with a conductive material 186 by, for example, depositing one or more conductive materials to a thickness sufficient to fill the contact openings and then removing the upper portion of the conductive materials using an etchback or chemical mechanical planarization process (CMP) to form conductive plugs filling the contact openings. The third conductive line 190, e.g., a bit line, can then be formed by depositing, patterning and etching a suitable conductive layer whereby the third conductive lines are in electrical contact with a plurality of semiconductor pillars aligned in the second direction DR2.

Figure 13:
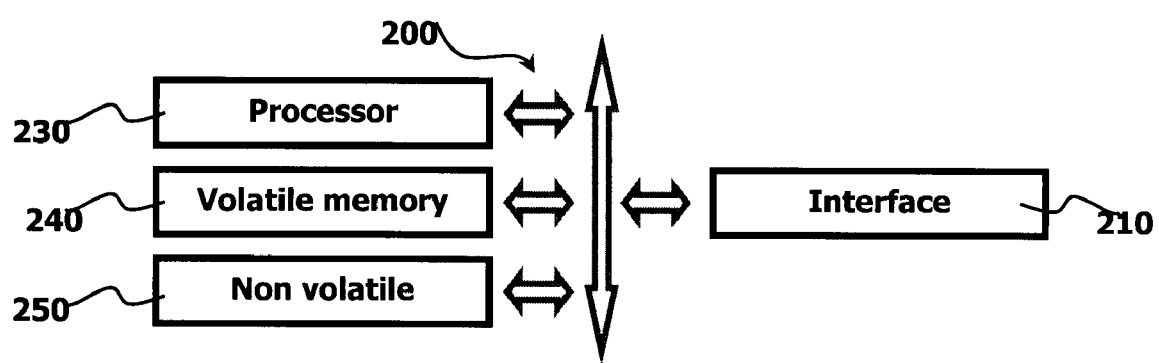
FIG. 13 illustrates the use of a memory array according to example embodiments of the disclosure in an IC card system.

As illustrated in FIG. 13, flash memory devices according to example embodiments described above and/or further defined in the claims provided below may be utilized in a variety of applications including, for example, Smart cards, secure digital (SD) cards, compact flash (CF) cards, memory sticks and multimedia cards. An example of such an application is illustrated in FIG. 13 in which the IC card system is represented by block diagram 200 and includes an interface 210, for example, an edge connector configured for engaging an electronic device to establish communication paths for receiving information (e.g., data and commands) from a host (not shown) such as a camera or card reader and transmitting information to the host. The IC card system 200 also includes a volatile memory 240 (e.g., a DRAM) for storing data generated by the processor 230 during operation and a nonvolatile memory 250 for storing, for example, application programs, configuration parameters, data and other information for communicating with the host and improving the operation of the card system.

We claim:

1. A method of fabricating a pair of semiconductor memory cells comprising:

forming a semiconductor pillar on a semiconductor substrate;

forming a charge storage structure on the semiconductor pillar;

forming a conductive pattern over the charge storage structure;

forming first and second source lines in the semiconductor substrate on opposite sides of the semiconductor pillar;

forming first and second trench isolation structures, thereby separating the conductive pattern into first and second word lines and separating the charge storage structure into first and second memory cells; and forming a common bit line contact to an upper surface of the semiconductor pillar.

2. The method of fabricating a pair of semiconductor memory cells according to claim 1, wherein forming the semiconductor pillar further comprises:

forming a hard mask layer on the semiconductor substrate;

forming a soft mask pattern on the hard mask layer to expose a portion of the hard mask layer;

etching the exposed region of the hard mask layer to form a hard mask pattern exposing a portion of the semiconductor substrate; and etching the exposed portions of the semiconductor substrate to form the semiconductor pillar.

3. The method of fabricating a pair of semiconductor memory cells according to claim 1, wherein forming the semiconductor pillar further comprises:

forming a mask layer on the semiconductor substrate;

patterning and etching the mask layer to form a mask pattern having an opening that exposes a portion of the semiconductor substrate;

filling the opening with an epitaxial semiconductor material; and removing the mask pattern.

4. The method of fabricating a pair of semiconductor memory cells according to claim 3, wherein forming the semiconductor pillar further comprises:

removing an upper portion of the epitaxial semiconductor material to expose an upper surface of the mask pattern and form a planarized surface.

5. The method of fabricating a pair of semiconductor memory cells according to claim 3, wherein forming the semiconductor pillar further comprises:

depositing a layer of an amorphous epitaxial material in the opening; and treating the amorphous epitaxial material to form a single crystal structure having a crystalline orientation corresponding to that of the semiconductor substrate.

6. The method of fabricating a pair of semiconductor memory cells according to claim 1, wherein forming the charge storage structure on the semiconductor pillar further comprises:

forming a tunnel layer pattern on a side surface of the semiconductor pillar;

forming a charge storage layer pattern on the tunnel layer pattern; and forming a blocking layer pattern on the charge storage layer pattern.

7. The method of fabricating a pair of semiconductor memory cells according to claim 6, wherein:

the tunnel layer pattern is formed from an insulating material selected from a group consisting of silicon oxides, silicon nitrides, silicon oxynitrides and combinations thereof;

the charge storage layer pattern is formed from a material selected from a group consisting of $Si_xN_y$, $Al_2O_3$, $HfAlO_x$, HfAlON, $HfSiO_x$, HfSiON and combinations thereof; and the blocking layer pattern is formed from an insulating material selected from a group consisting of $SiO_x$, $Si_xN_y$, $Al_2O_3$, $HfAlO_x$, HfAlON, $HfSiO_x$, HfSiON and combinations thereof.

8. The method of fabricating a pair of semiconductor memory cells according to claim 1, wherein forming the conductive pattern over the charge storage structure further comprises:

depositing a layer of a conductive material selected from a group consisting of TaN, NiTa, Ti, TiN, Ta, W, WN, Hf, Nb, Mo, $Ru_2O$, $Mo_2N$, Ir, Pt, Co, Cr and alloys thereof, polysilicon, and combinations thereof; and removing a portion of the layer of conductive material using a blanket etch to form a conductive sidewall structure on an outer surface of the charge storage structure.

9. The method of fabricating a pair of semiconductor memory cells according to claim 6, wherein forming the charge storage structure on the semiconductor pillar further comprises:

forming the charge storage layer pattern from polysilicon.

10. The method of fabricating a pair of semiconductor memory cells according to claim 9, wherein forming the conductive pattern further comprises:

forming a doped polysilicon layer with a quantity of a dopant sufficient to alter a work function by at least 0.2 eV relative to a work function obtained with undoped polysilicon.

11. A method of fabricating an array of pairs of semiconductor memory cells comprising:

forming an array of semiconductor pillars on a semiconductor substrate;

forming a charge storage structure on each of the semiconductor pillars;

forming a conductive pattern of conductive elements and spaces to define first groups of charge storage structures, wherein each first group is arranged along an axis parallel to an axis DR1 and each member of each first group shares a single conductive element;

forming first and second source lines in the semiconductor substrate between adjacent conductive elements;

forming first and second trench isolation structures, thereby separating each of the conductive patterns into first and second word lines and separating each of the charge storage structures into first and second memory cells;

forming a common bit line contact to an upper surface of the semiconductor pillar; and forming common bit lines for electrically connecting second groups of first and second memory cells arranged along an axis parallel to a second axis DR2, wherein each memory cell is common to only one first group and one second group.

12. The method of fabricating an array of pairs of semiconductor memory cells according to claim 11 wherein:

each first group aligned along a single axis is separated from adjacent first groups aligned along parallel axes by a pitch P1; and each pillar in a first group are separated from adjacent pillars within the first group by a pitch P2, wherein P1>P2.

13. The method of fabricating an array of pairs of semiconductor memory cells according to claim 12 wherein forming the conductive pattern further comprises:

forming a conformal conductive layer having a thickness $T_0$;

etching the conductive layer using an anisotropic etch to form sidewall structures having a lateral base thickness of $T_L$, wherein $P2<2T_L$.

14. The method of fabricating an array of pairs of semiconductor memory cells according to claim 13 wherein:

a minimum conductive pattern thickness measured between adjacent semiconductor pillars will be no less than 50% of $T_0$.

15. The method of claim 1, wherein the first and second wordlines are physically and electrically separated from one another by the first and second trench isolation structures.

16. The method of claim 15, wherein the first and second memory cells are also physically and electrically separated from one another by the first and second trench isolation structures.

17. The method of claim 11, wherein the first and second wordlines are physically and electrically separated from one another by the first and second trench isolation structures.

18. The method of claim 17, wherein the first and second memory cells are also physically and electrically separated from one another by the first and second trench isolation structures.

19. The method of claim 1, wherein the first and second memory cells are physically and electrically separated from one another by the first and second trench isolation structures.

20. The method of claim 11, wherein the first and second memory cells are physically and electrically separated from one another by the first and second trench isolation structures.

* * * * *